(12) United States Patent
Oyu et al.

(10) Patent No.: US 8,569,830 B2
(45) Date of Patent: Oct. 29, 2013

(54) SEMICONDUCTOR DEVICE HAVING VERTICAL MOS TRANSISTOR AND METHOD FOR MANUFACTURING THE SEMICONDUCTOR DEVICE

(75) Inventors: Kiyonori Oyu, Tokyo (JP); Yoshihiro Takaishi, Tokyo (JP); Yu Kosuge, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 738 days.

(21) Appl. No.: 12/230,562

(22) Filed: Sep. 2, 2008

(65) Prior Publication Data
US 2009/0065856 A1 Mar. 12, 2009

(30) Foreign Application Priority Data
Sep. 7, 2007 (JP) ................................. 2007-232591

(51) Int. Cl.
*H01L 29/66* (2006.01)
(52) U.S. Cl.
USPC .................... 257/329; 257/353; 257/E29.262
(58) Field of Classification Search
USPC .......... 257/353, 329, 302, E29.262; 438/268
See application file for complete search history.

(56) References Cited

U.S. PATENT DOCUMENTS

| 6,632,723 | B2* | 10/2003 | Watanabe et al. ............. 438/421 |
| 7,176,089 | B2 | 2/2007 | Furukawa et al. |
| 2002/0030214 | A1 | 3/2002 | Horiguchi |
| 2003/0001290 | A1* | 1/2003 | Nitayama et al. ............. 257/907 |
| 2006/0157734 | A1 | 7/2006 | Onodera et al. |
| 2011/0183484 | A1* | 7/2011 | Oyu ............................. 438/270 |

FOREIGN PATENT DOCUMENTS

| JP | 4-264776 | 9/1992 |
| JP | 6-53513 | 2/1994 |
| JP | 2002-94027 | 3/2002 |
| JP | 2005-501424 | 1/2005 |
| JP | 2006-196802 | 7/2006 |

* cited by examiner

*Primary Examiner* — Chuong A Luu
*Assistant Examiner* — Nga Doan
(74) *Attorney, Agent, or Firm* — McGinn IP Law Group, PLLC

(57) ABSTRACT

In a vertical MOS transistor in which a semiconductor pillar is formed by etching a semiconductor substrate in a portion surrounded by an isolation film, the semiconductor pillar is covered with a gate insulating film and a gate electrode to be made a channel part, and diffusion layers to be a source and a drain are included on a top and a bottom of the channel part, electrode which controls potential of a gate electrode material is formed in gate electrode material formed on a side surface of isolation film, in order to eliminate a parasitic MOS operation by the gate electrode material remaining on the side surface of the isolation film.

21 Claims, 23 Drawing Sheets

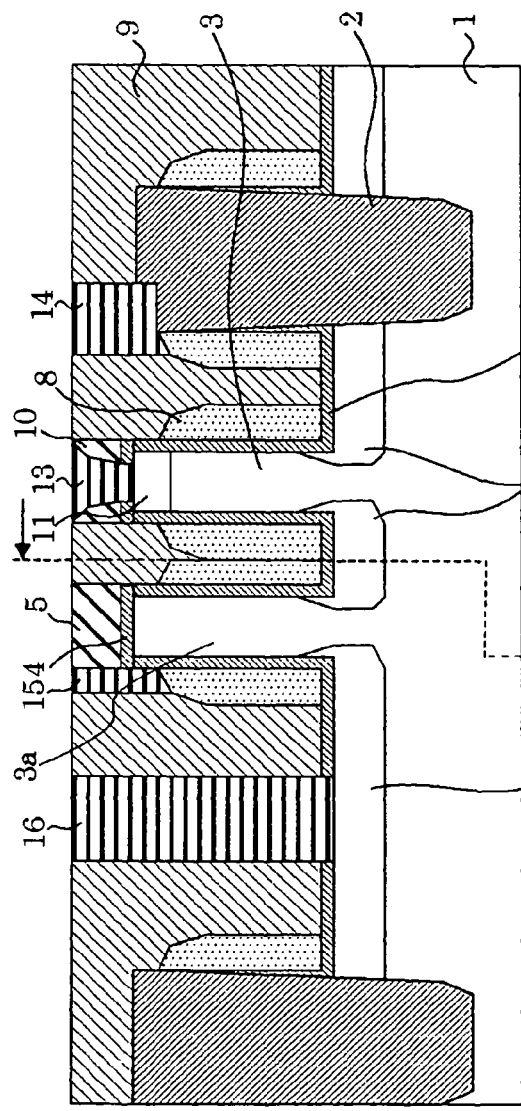
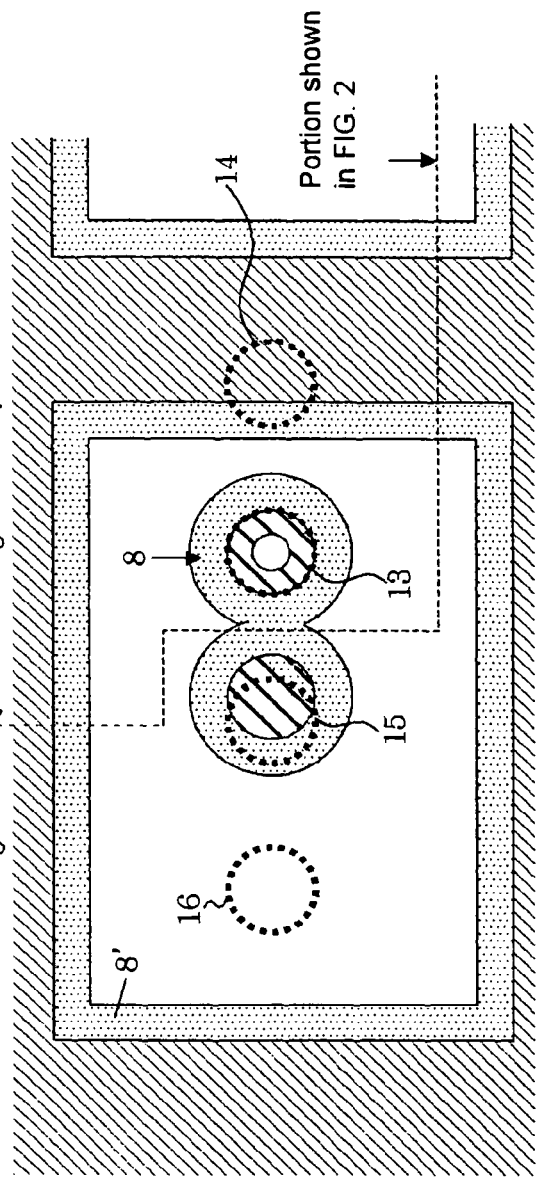
FIG. 3A
FIG. 3B

Prior Art

SEMICONDUCTOR DEVICE HAVING VERTICAL MOS TRANSISTOR AND METHOD FOR MANUFACTURING THE SEMICONDUCTOR DEVICE

BACKGROUND OF THE INVENTION

1. Field of the Invention

The present invention relates to a semiconductor device, more specifically, a semiconductor device having a vertical MOS transistor.

2. Description of the Related Art

Recently, a three-dimensional structure type MOSFET in which a gate structure is made three-dimensional is proposed for increasing an integration degree of a semiconductor device. Such as the three-dimensional structure type MOSFETs, an FinFET in which a channel layer of a Fin structure is sandwiched by gate electrodes, an surrounding gate transistor (hereinafter, called SGT) in which agate electrode is formed around a silicon pillar are known.

Of them, an SGT has the structure in which the source, the gate and the drain are disposed in the perpendicular direction to the substrate, and the gate surrounds the silicon pillar. Accordingly, an SGT has the occupation area reduced significantly as compared with a planar type MOSFET. Therefore, an SGT is significantly expected to be applied to a DRAM, Flash EEP ROM and CMOS.

In an SGT structure, for example, as shown in FIGS. 11A and 11B, in Japanese Patent Laid-Open No. 6-53513, microscopic columnar protrusion (silicon pillar) 103 in a circular cylindrical shape is placed in the region surrounded by element isolation insulating film 102 formed by a LOCOS method on p-type silicon substrate 101, and a source and drain region constituted of n-type diffusion layers (upper diffusion layer 107 and lower diffusion layer 104) are respectively formed on the top portion and bottom portion of the columnar protrusion, and gate electrode 106 is formed around the columnar protrusion via gate insulating film 105. In this document, contact 109 to the gate electrode is taken from the gate material which is led outside the element isolation region. Contacts 108, 110 are connected to upper diffusion layer 107, and lower diffusion layer 104, respectively. Here, FIG. 11A is a plane view, and FIG. 11B is a sectional view.

While miniaturization of elements is underway, element isolation by a LOCOS method has the problem of being incapable of forming a microscopic element isolation region. Thus, element isolation region of 250 nm or less becomes possible by a shallow trench isolation (hereinafter, called STI).

When an SGT structure is provided by forming a silicon pillar in the region of the silicon substrate subjected to element isolation by such STI, if STI is to be formed after the silicon pillar is formed, the substrate thickness is required by that amount, and the silicon pillar has to be protected at the time of formation of STI. Thus, formation of the silicon pillar by etching the substrate after formation of STI is generally conceivable.

Thereafter, the lower diffusion layer is formed, an insulating film is formed on the silicon substrate including the side surface of the silicon pillar, the gate electrode material is deposited, and the SGT structure in which the gate electrode is formed on the side surface of the silicon pillar by etch back or the like is completed.

In the conventional planar type MOS transistor, an unnecessary portion of the gate electrode material is all removed at the time of processing the gate electrode, and therefore, the portion which becomes floating state is not formed.

However, in the case of forming the vertical MOS transistor in which the silicon pillar is formed by etching the silicon substrate at the area surrounded by the STI region, the channel part is formed by covering the silicon pillar with the gate insulating film and the gate electrode, and the diffusion layers to be the source and drain are included on the top and bottom of the channel part, the gate electrode material remains on the side surface of the STI insulating film at the time of formation of the gate electrode.

The gate electrode material remaining on the side surface of the STI insulating film is brought into a floating state, and as a result, when electric charge is injected into the gate electrode material brought into the floating state by certain influence during operation of the MOS transistor, its potential changes to cause the problem that the parasitic MOS in the STI region operates.

When the diameter of the silicon pillar is made smaller, the contact to the upper diffusion layer and the contact to the gate electrode move closer to each other, and ultimately, separation of the contacts becomes difficult. As shown in Japanese Patent Laid-Open No. 6-53513, leading the gate contact to the outside of the element isolation region is difficult due to interference of the height of the STI insulating film, and formation of the gate contact with an easier method is desired.

The present inventor has recognized that, in the vertical MOS transistor in which the silicon pillar is formed by etching the silicon substrate at the portion surrounded by the STI region, the channel part is formed by covering the silicon pillar with the gate insulating film and the gate electrode, and the diffusion layers to be the source and drain are included on the top and bottom of the channel part, the parasitic MOS operation by the gate electrode material remaining on the side surface of the STI insulating film becomes a problem.

Further, separation of the upper diffusion layer contact and the gate contact when a microscopic silicon pillar is formed is difficult.

SUMMARY

The present invention seeks to solve one or more of the above problems, or to improve upon those problems at least in part.

In one embodiment, there is provided a semiconductor device including a vertical MOS transistor that includes an isolation layer formed in circular pattern in a semiconductor substrate defining an isolation area, a semiconductor pillar formed in the isolation area, a first gate electrode formed above a sidewall of the semiconductor pillar, a second gate electrode formed above a sidewall of the isolation layer, and an electrode electrically coupled to the second gate electrode supplying a predetermined voltage to prevent the second gate from a floating state.

Further, in another embodiment, there is provided a semiconductor device including a vertical MOS transistor that includes the vertical MOS transistor including a semiconductor pillar formed in an area subjected to shallow trench isolation layer of a semiconductor substrate, a lower diffusion layer shallower than depth of the shallow trench isolation, in the semiconductor substrate at a lower portion of the semiconductor pillar, an upper diffusion layer at an upper portion of the semiconductor pillar, a channel part formed in a region sandwiched by the upper and lower diffusion layers, a gate insulating film and a gate electrode are included on a side surface of the channel part, a conductive sidewall on a side surface of an insulating film of the shallow trench isolation, and an electrode electrically coupled to the conductive sidewall supplying a predetermined voltage to prevent the conductive sidewall from a floating state.

According to the present invention, by supplying a predetermined voltage to the gate electrode material remaining on the side surface of the STI insulating film, and by controlling the potential, the problem of the gate electrode material remaining on the side surface of the STI insulating film being brought into a floating state can be solved. As a result, the stable operation of the integrated circuit using the vertical MOS transistor is made possible.

Further, by providing a dummy transistor at least partially in contact with the gate electrode material of the side surface of the STI insulating film, and by providing the electrode contacting the gate electrode, the dummy transistor contact can be formed in the same process as the gate extraction electrode of the vertical MOS transistor, and the potential of the gate electrode material remaining on the side surface of the STI insulating film can be controlled via the dummy transistor contact. Therefore, the process can be simplified.

Further, by bringing the gate electrode material of the side surface of the STI insulating film and the gate electrode of the vertical MOS transistor into contact with each other, or by bringing them into contact with each other via the dummy transistor, the problem of the gate electrode material remaining on the side surface of the STI insulating film being brought into a floating state can be solved, and at the same time, the gate potential of the vertical MOS transistor can be controlled. Therefore, formation of a new contact for the gate electrode of the vertical MOS transistor is not required, and the degree of freedom of the wiring layout increases.

BRIEF DESCRIPTION OF THE DRAWINGS

The above features and advantages of the present invention will be more apparent from the following description of certain preferred embodiments taken in conjunction with the accompanying drawings, in which:

FIG. 2A is a partial sectional view showing the configuration of the semiconductor device which is the first exemplary embodiment of the present invention, whereas

FIG. 3A is a sectional view showing the configuration in one element isolation unit of the semiconductor device which is the first exemplary embodiment of the present invention, whereas FIG. 3B is a schematic plane view of the same;

FIG. 5A is a partial sectional view showing the configuration of the semiconductor device which is the second exemplary embodiment of the present invention, whereas

FIG. 8A is a partial sectional view showing the configuration of the semiconductor device which is the third exemplary embodiment of the present invention, whereas

FIG. 10A is a partial sectional view showing the configuration of the semiconductor device which is the fourth exemplary embodiment of the present invention, whereas FIG. 11A is a plane view of an SGT structure which is a related art, whereas

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

Configuration of the First Exemplary Embodiment

Figure 2A:
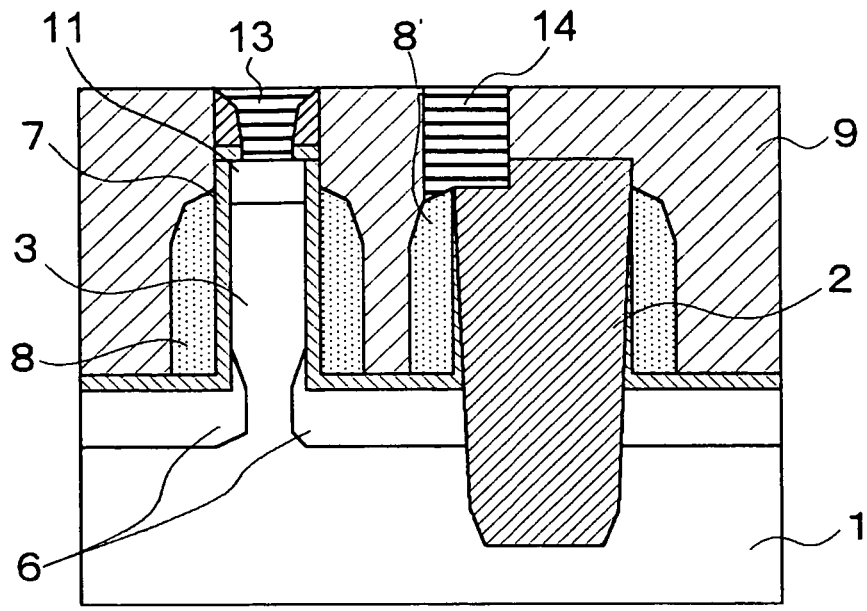

As shown in the sectional view of FIG. 2A, in a semiconductor device in which a vertical MOS transistor including lower diffusion layer 6 and upper diffusion layer 11, with Si pillar 3 made a channel part, and including gate insulating film 7 and gate electrode 8 on a side wall of the channel part is formed in a region surrounded by STI insulating film 2, and lower diffusion layer 6 is formed in a portion shallower than the depth of STI, a contact and STI sidewall electrode 14 are formed in gate electrode material 8' (hereinafter, called a conductive sidewall) formed on a side wall of STI insulating film 2.

Figure 2B:
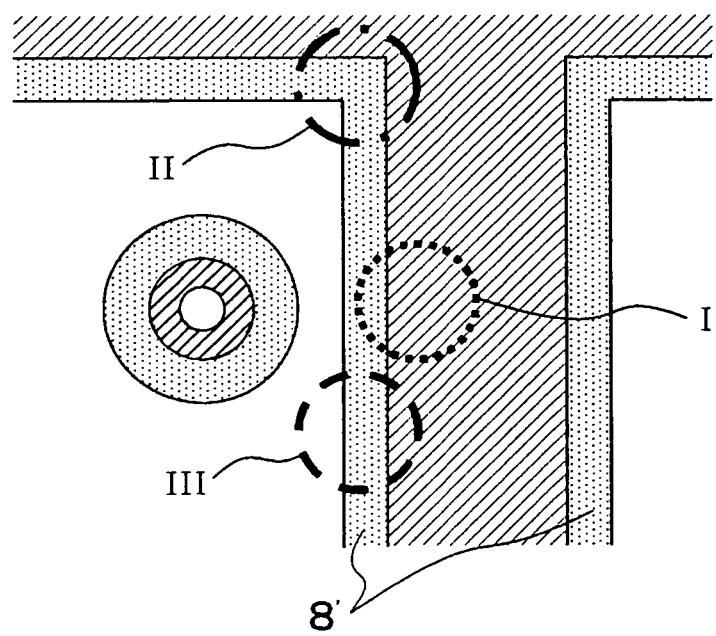
FIG. 2B is a schematic plane view of the same.

FIGS. 3A and 3B show the portions shown in FIGS. 2A and 2B by expanding them to the entire region surrounded by STI insulating film 2, and as gate electrodes 8 formed on the sidewalls of Si pillar 3 and Si pillar 3a are in contact with each other, gate extraction electrode 15 of the vertical MOS transistor can be led out at an upper portion of Si pillar 3a by providing a contact hole in insulating film 9. Here, Si pillar 3a configures a dummy transistor. Doping for Si pillar 3a may be the same conductive type doping as for lower diffusion layer 6, or may be the same conductive type doping as for the channel of Si pillar 3. Further, lower diffusion layer electrode 16 is formed at an optional position within the element isolation region by providing a contact hole in insulating film 9.

The description of the manufacturing method will be described by using FIGS. 2A and FIG. 2B.

For electrode 14 which contacts conductive sidewall 8' formed on the side surface of STI insulating film 2, an optional place can be selected like contact (I) to contact (III), as shown in the plane view of FIG. 2B. The contact position can be selected in the portion which does not interfere with the disposition of electrode 13 connected to upper diffusion layer 11 of the vertical MOS transistor, and disposition of wiring on the upper layer from it.

As described above, by supplying a predetermined voltage to electrode 14 which contacts with conductive sidewall 8' formed on the side surface of STI insulating film 2, conductive sidewall 8' can be prevented from being brought into a floating state.

Manufacturing Method of the First Exemplary Embodiment

A method for manufacturing the present exemplary embodiment shown in FIGS. 2A and 3A will be described by using FIG. 1A to FIG. 1H.

In the method for manufacturing the semiconductor device including the vertical MOS transistor in the first exemplary embodiment includes (1) forming a trench for shallow trench isolation in a semiconductor substrate, and burying an element isolation insulating film in the trench, (2) forming an insulating film to be a mask for forming a semiconductor pillar, in a region subjected to shallow trench isolation, (3) etching the semiconductor substrate in the region subjected to the shallow trench isolation with said insulating film as a mask, and forming a semiconductor pillar for the vertical MOS transistor, (4) implanting an impurity onto the semiconductor substrate, and forming a lower diffusion layer in the portion shallower than the depth of the shallow trench isolation, (5) forming a gate insulating film on the semiconductor substrate and the side surface of the semiconductor pillar for the vertical MOS transistor;

(6) depositing a gate electrode material, etching back the gate electrode material, and leaving a gate electrode material on the side surface of the semiconductor pillar for the vertical MOS transistor on which the gate insulating film is formed, and leaving the gate electrode material on the side surface of the element isolation insulating film, (7) forming an interlayer insulating film and flattening the interlayer insulating film to the height of the mask insulating film, (8) removing the mask insulating film on the semiconductor pillar for the vertical MOS transistor, and forming a sidewall insulating film in an opening which is formed, (9) implanting an impurity via the sidewall insulating film, and forming an upper diffusion layer on the top portion of the semiconductor pillar for the vertical MOS transistor, and

(10) forming an electrode which contacts the gate electrode material on the side surface of the element isolation insulating film.

Figure 1A:
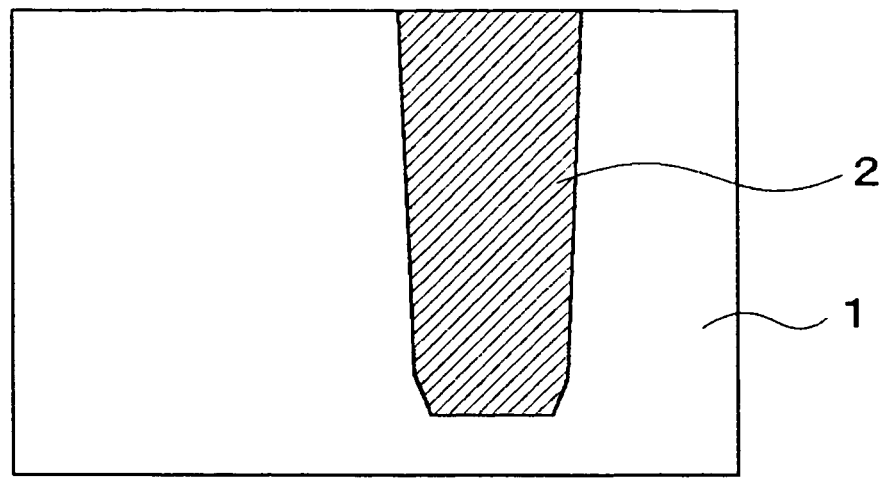
FIG. 1A to FIG. 1H are sectional views explaining one process of a manufacturing process of a semiconductor device which is a first-exemplary, embodiment of the present invention.

First, as shown in FIG. 1A, STI insulating film 2 is formed in Si substrate 1 in which a well layer with a boron concentration of $1e17/cm^3$ is formed. The STI insulating film 2 can be formed by an ordinary method. Specifically, STI insulating film 2 is formed by forming a trench for STI in the silicon substrate by Si dry etching, burying the insulating film in the trench and flattening it. Here, the depth of STI is set at 220 nm.

Figure 1B:
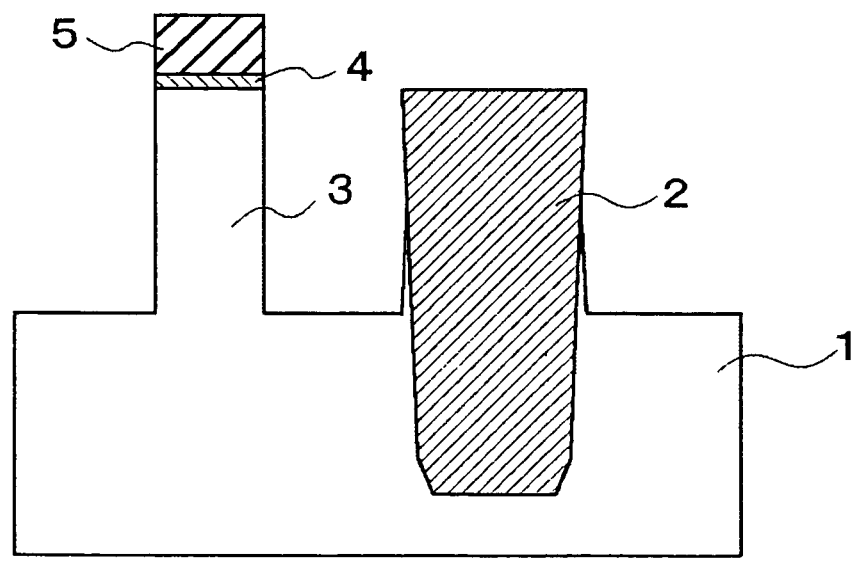

Next, as shown in FIG. 1B, an Si processing mask (shown by $SiO_2$ film 4 of a film thickness of 10 nm and SiN film 5 of a film thickness of 80 nm in the drawing) is formed in the portion where Si pillar 3 is to be formed, and Si pillar 3 is formed by ordinary Si dry etching. At this time, the diameter of Si pillar 3 is set at 100 nm, and the height of the Si pillar is set at 120 nm. In the sectional view, Si pillar 3 is shown as if it were not surrounded by STI insulating film 2, but Si pillar 3 is formed in the portion surrounded by the shallow trench isolation region (STI insulating film 2) in plane view, as shown in FIG. 3B. Further, Si pillar 3a can be formed similarly, but the description of Si pillar 3a will be omitted in the following description unless it is necessary since Si pillar 3a is treated in the same process as Si pillar 3.

Figure 1C:
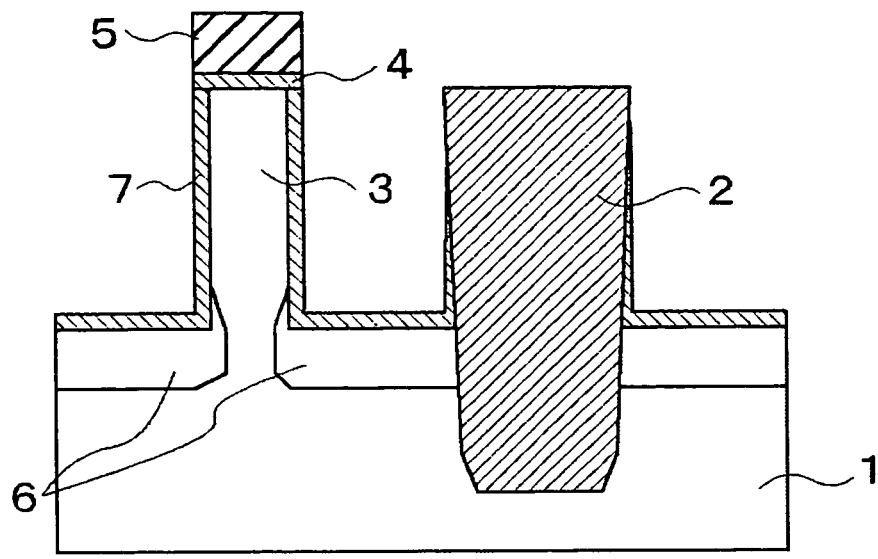

Thereafter, as shown in FIG. 1C, lower diffusion layer 6 and gate insulating film 7 are formed. Lower diffusion layer 6 is formed by ordinary ion implantation (arsenic, 20 keV, $3e13/cm^2$) and thermal treatment (in $N_2$, 1000° C., 10 s). Gate insulating film 7 may formed by thermally oxidizing the side surface of the Si pillar, or may be formed by an ordinary film deposition method. In this case, gate oxide film 7 of a film thickness of 5 nm is formed by thermal oxidation (wet-$O_2$, 800° C.).

Figure 1D:
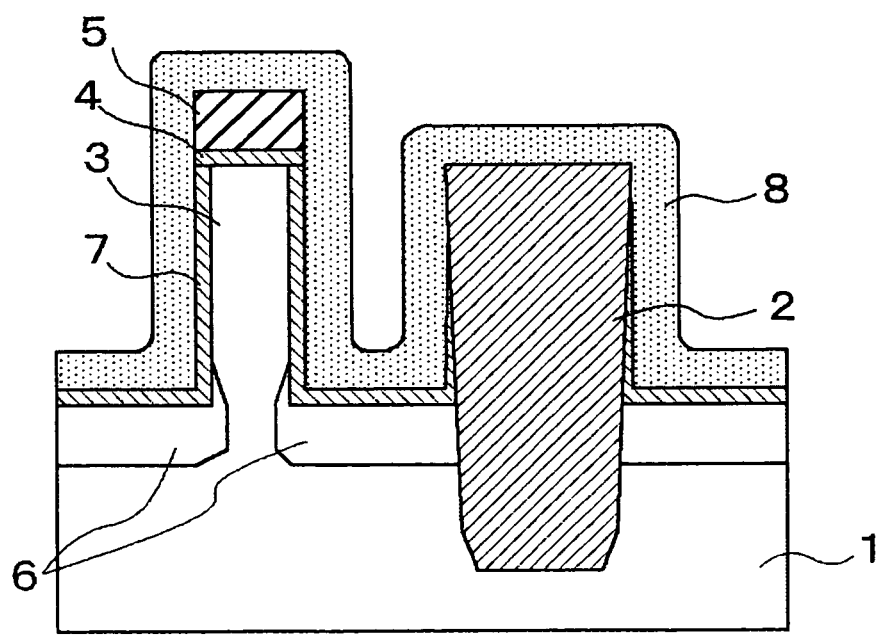
Figure 1E:
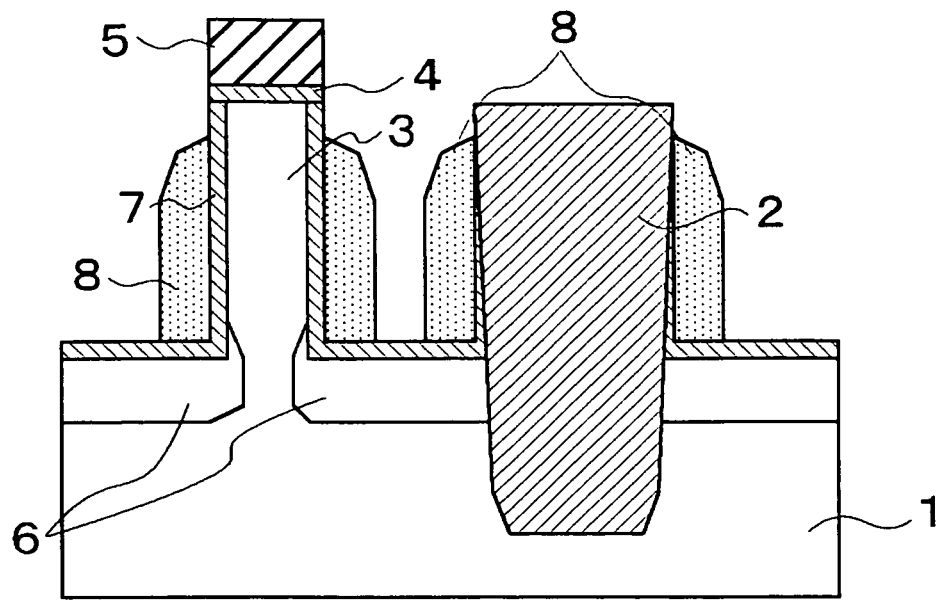

Next, as shown in FIG. 1D, after gate electrode material 8 is deposited on the entire surface, gate electrode 8 is formed on the side surface of Si pillar 3 by an ordinary etch back method as shown in FIG. 1E. In this case, as the gate electrode material, polycrystalline silicon of a film thickness of 50 nm with phosphor doped by $4e20/cm^3$ is used. At this time, the gate electrode material (conductive sidewall 8') also remains on the side surface of STI insulating film 2.

Figure 1F:
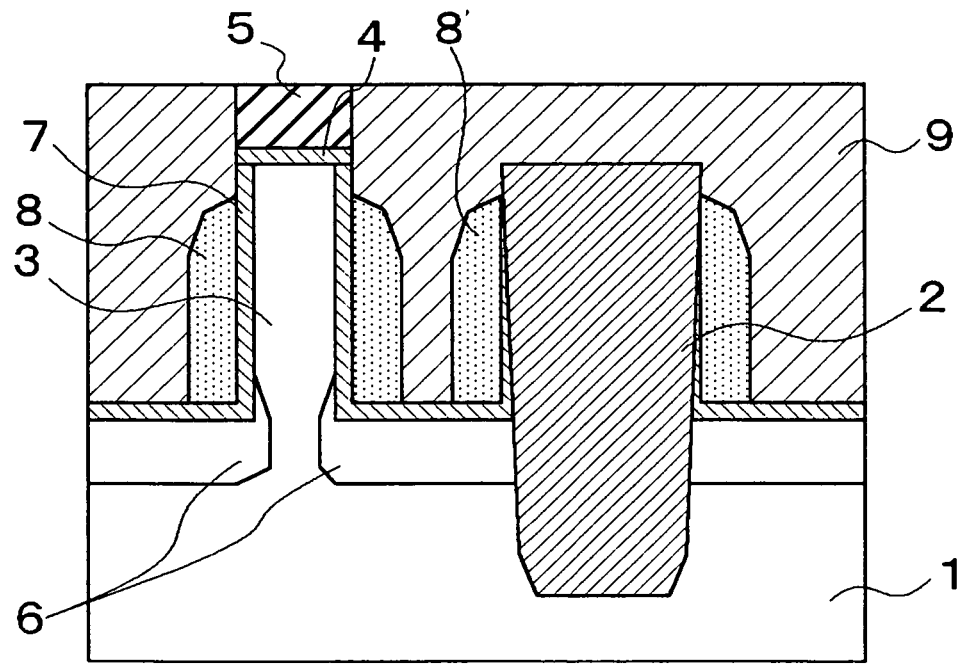

Thereafter, as shown in FIG. 1F, insulating film 9 is deposited and flattened. In this case, a silicon oxide film is used as insulating film 9, and flattening is carried out by an ordinary CMP (Chemical Mechanical Polishing) method. The stopper in the CMP method is SiN film 5 which is used as the Si pillar processing mask.

Figure 1G:
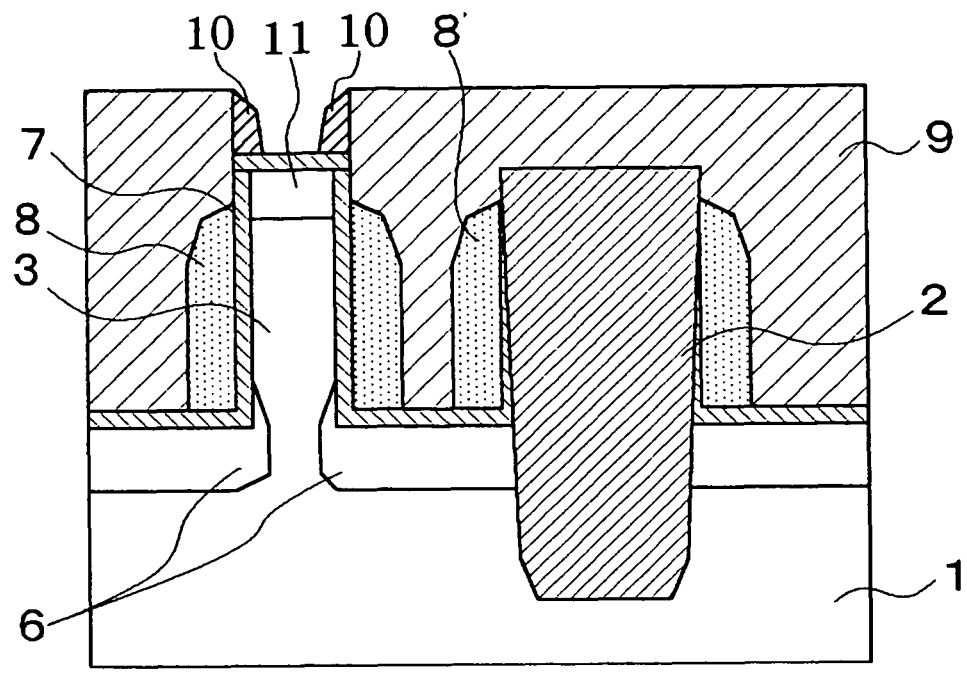

Subsequently, as shown in FIG. 1G. SiN film 5 on Si pillar 3 is removed, and sidewall 10 of an insulating film is formed on the side surface of the opening of the portion where SiN film 5 is removed. SiN film 5 on Si pillar 3a is kept not to be removed by being covered with an insulating film as shown in the example which will be described later. In this case, sidewall 10 is formed by using an SiN film, and by etching back the SiN film after depositing the SiN film. Next, upper diffusion layer 11 is formed by ion implantation (arsenic, 20 keV, $3e13/cm^2$) and thermal treatment (in $N_2$, 1000° C., 10 s) after formation of sidewall 10.

Figure 1H:
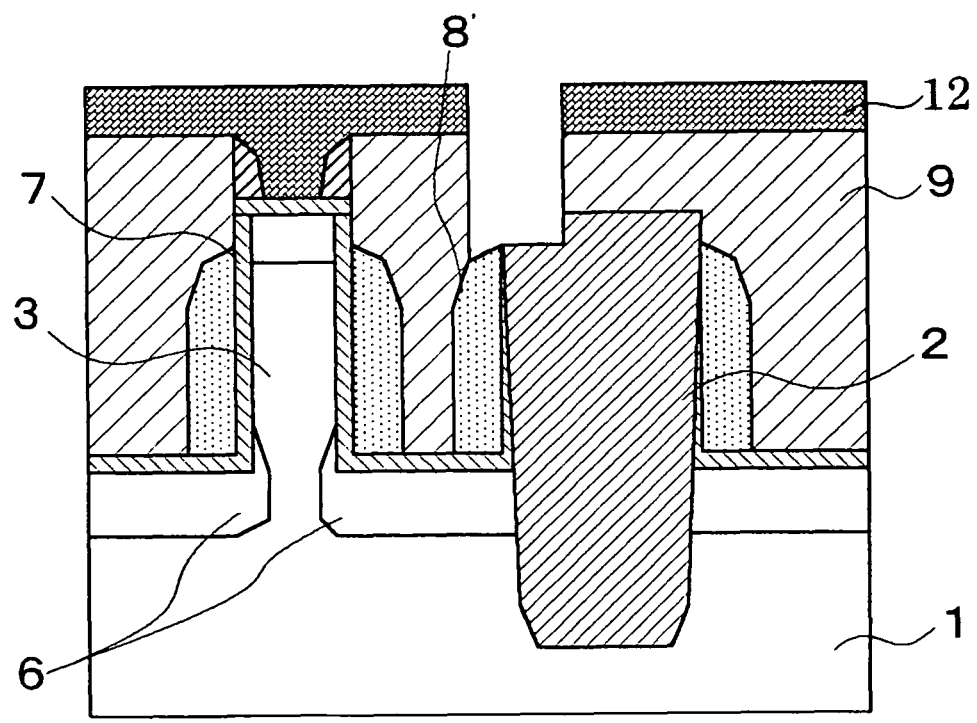

Next, as shown in FIG. 1H, a contact hole is provided in insulating film 9 in the portion where STI sidewall electrode 14 is formed. In this case, resist mask 12 is formed by ordinary photolithography, and the contact hole is provided. Finally, after resist mask 12 is removed, silicon oxide film 4 is etched with insulating film sidewall 10 as the mask to expose upper diffusion layer 11, and electrode 13 and electrode 14 are buried. In this case, electrodes 13 and 14 are made from tungsten and formed by deposition of a tungsten film and a CMP method. Further, gate extraction electrode 15 and lower diffusion layer electrode 16 as shown in FIGS. 3A and 3B are formed.

The structure shown in FIG. 2A and FIG. 3A is completed by the method as above. Bias which does not turn on conductive sidewall 8' formed on the side surface of STI insulating film 2 as parasitic MOS can be applied to electrode 14, separately from gate electrode 8 of the vertical MOS transistor. Naturally, electrode 14 may be connected to gate extraction electrode 15 in an upper layer so as to be operated at the same potential as gate electrode 8 of the vertical MOS transistor.

Second Exemplary Embodiment

Configuration of the Second Exemplary Embodiment

Figure 5A:
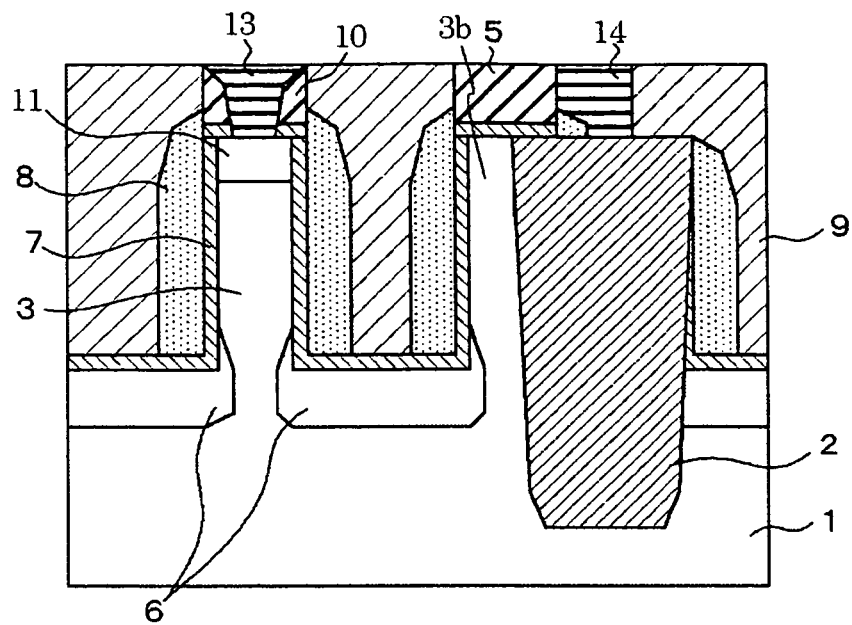
Figure 5B:
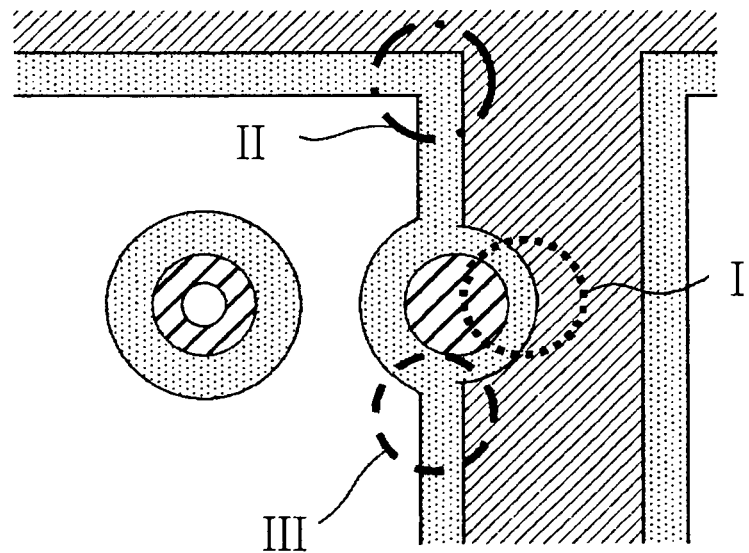
FIG. 5B is a schematic plane view of the same.

As shown in the sectional view of FIG. 5A and the plane view of FIG. 5B, in a semiconductor device in which a vertical MOS transistor including lower diffusion layer 6 and upper diffusion layer 11, with Si pillar 3 made a channel part, and including gate insulating film 7 and gate electrode 8 on the side of the channel part is formed in a region surrounded by STI insulating film 2, and lower diffusion layer 6 described above is formed in a portion shallower than the depth of STI, a gate electrode material or a silicon pillar of a dummy transistor formed through the same process as the above described vertical MOS transistor is formed on the side wall of STI insulating film 2 so as to be at least in contact with the side wall, and a contact (dummy transistor contact (I)) and electrode 14 are formed in gate electrode material 8 of the above described dummy transistor in contact with the side surface of STI insulating film 2.

As described above, the dummy transistor is formed in contact with the side wall of STI insulating film 2, and the potential of electrode 14 in contact with the gate electrode material of the dummy transistor is controlled, whereby the gate electrode material (conductive sidewall 8') remaining on the side surface of the STI insulating film can be prevented from being brought into a floating state. Further, in this example, the contact is formed in the gate electrode material of the dummy contact. Therefore, electrode 14 can be formed at the same time as formation of gate extraction electrode 15 of the vertical MOS transistor, and the process can be simplified.

Figure 6A:
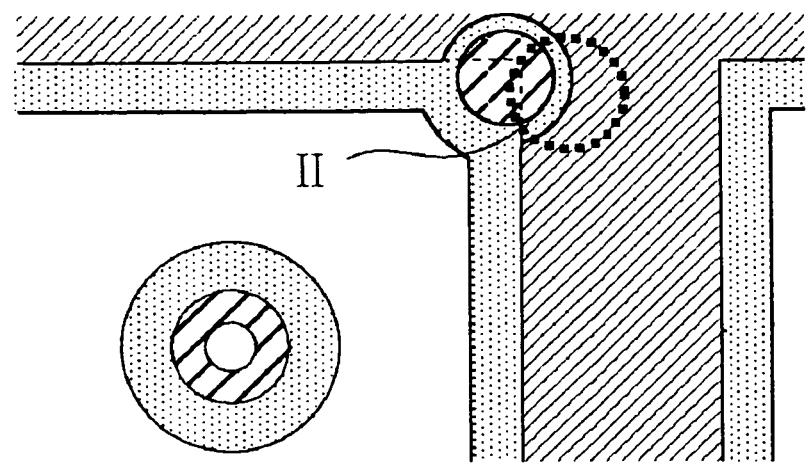
FIGS. 6A and 6B are schematic plane views explaining modified examples of a contact position in the semiconductor device which is the second exemplary embodiment of the present invention.
Figure 6B:
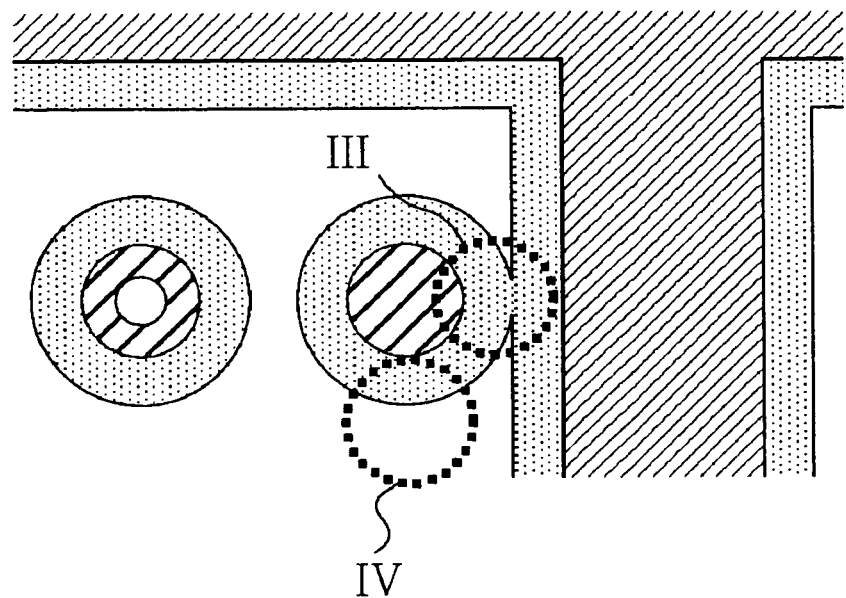

In this example, Si pillar 3b configuring the dummy transistor is formed in contact with one side surface of STI insulating film 2, but as shown in FIG. 6A, Si pillar 3b may be formed at a corner portion of STI insulating film 2, and a contact (dummy transistor contact (II)) and electrode 14 may be formed in the gate electrode material of the dummy transistor. Further, as shown in FIG. 6B, Si pillar 3b is formed by being separated from STI insulating film 2 so that only gate electrode material 8 is in contact with Si pillar 3b, and a contact (dummy transistor contact (III) or (IV)) and electrode 14 may be formed in the gate electrode material of the dummy transistor. By optionally selecting the formation positions of the dummy transistor and its contact like this, the formation positions can be selected in the position which does not interfere with disposition of electrode 13 connected to upper diffusion layer 11 of the vertical MOS transistor and disposition of the wiring further on an upper layer of it.

Manufacturing Method of the Second Exemplary Embodiment

A method for manufacturing the exemplary embodiment shown in FIG. 5A will be described by using FIG. 4A to FIG. 4H.

In the method for manufacturing the semiconductor device including the vertical MOS transistor according to the second exemplary embodiment includes (1) forming a trench for shallow trench isolation in a semiconductor substrate, and burying an element isolating insulating film in the trench;

(2) forming an insulating film to be a mask for forming a semiconductor pillar for the vertical MOS transistor, in a region subjected to shallow trench isolation, and an insulating film to be a mask for forming a semiconductor pillar for the dummy transistor to be close to or to be partially overlaid on the region subjected to the shallow trench isolation;

(3) etching the semiconductor substrate in the region subjected to the shallow trench isolation with the mask insulating film, and forming semiconductor pillars for the vertical MOS transistor and the dummy transistor;

(4) implanting an impurity onto the semiconductor substrate, and forming a lower diffusion layer in the portion shallower than the depth of the shallow trench isolation;

(5) forming a gate insulating film on the semiconductor substrate and the side surfaces of the semiconductor pillars for the vertical MOS transistor and the dummy transistor;

(6) depositing a gate electrode material, etching back the gate electrode material, and leaving a gate electrode on the side surface of the semiconductor pillar for the vertical MOS transistor on which the gate insulating film is formed, and leaving the gate electrode material continuing from the side surface of an element isolation insulating film to the side surface of the semiconductor pillar for the dummy transistor;

(7) forming an interlayer insulating film and flattening the interlayer insulating film to the height of the mask insulating film;

(8) removing the mask insulating film on the semiconductor pillar for the vertical MOS transistor, and forming a side wall insulating film in an opening which is formed;

(9) implanting an impurity via the side wall insulating film, and forming an upper diffusion layer on the top portion of the semiconductor pillar for the vertical MOS transistor; and

(10) forming an electrode which contacts the gate electrode material on the side surface of the semiconductor pillar of the dummy transistor.

Figure 4A:
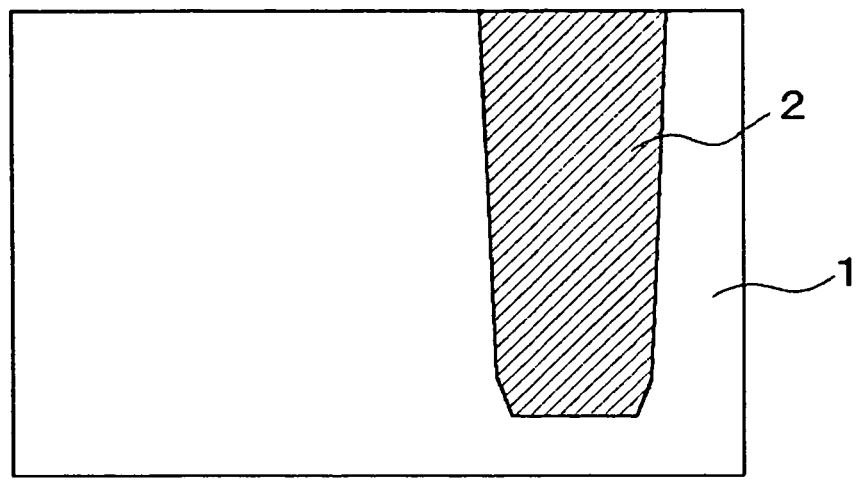
FIG. 4A to FIG. 4H are sectional views explaining one process of a manufacturing process of a semiconductor device which is a second exemplary embodiment of the present invention.

First, as shown in FIG. 4A, STI insulating film 2 is formed in Si substrate. The method for forming the well and STI insulating film 2 is as in the first exemplary embodiment.

Figure 4B:
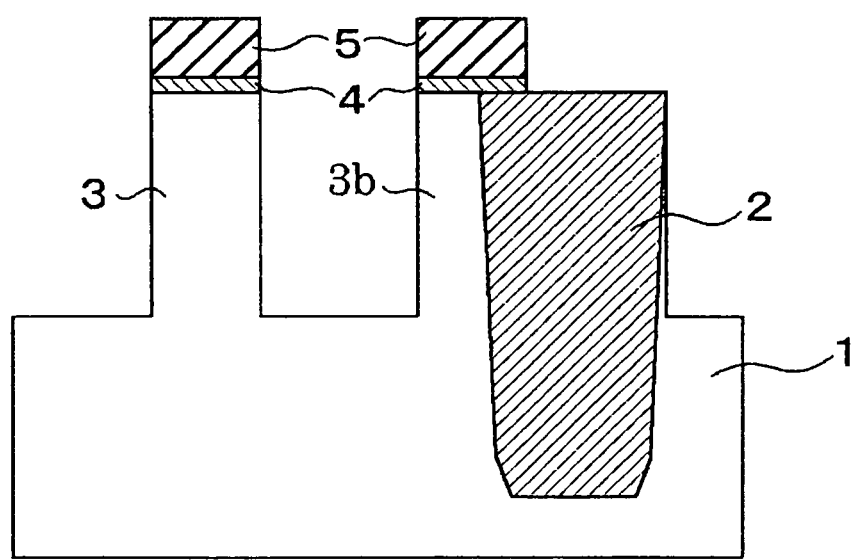

Next, as shown in FIG. 4B, Si processing masks (4, 5) are formed in the portion where Si pillars 3 and 3b are to be formed as in the first exemplary embodiment, and Si pillars 3 and 3b are formed by ordinary Si dry etching. Here, the constitution differing from that of the first exemplary embodiment is that Si pillar 3b in contact with the side surface of STI insulating film 2 is also formed for the dummy transistor. In the sectional view, Si pillar 3 at the left side in the drawing is shown as if it were not surrounded by STI insulating film 2, but Si pillar 3 at the left side in the drawing is formed in the portion surrounded by STI insulating film 2, as shown in FIGS. 3A and 3B in plane view. Further, Si pillar 3a is also formed at the left side of Si pillar 3 as shown in FIGS. 3A and 3B. The method for forming the above described Si pillars 3 and 3b is the same as that of the first exemplary embodiment.

Figure 4C:
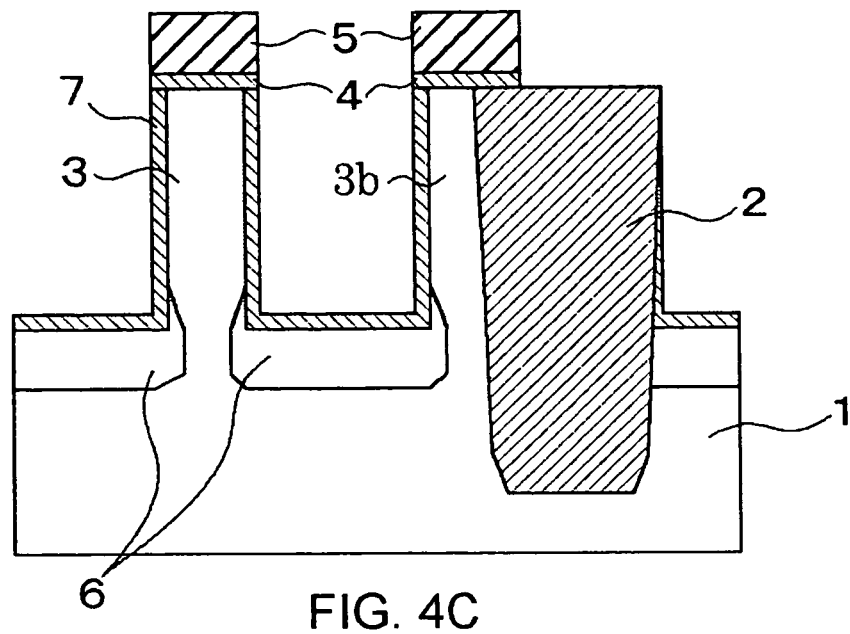

Thereafter, as shown in FIG. 4C, lower diffusion layer 6 and gate insulating film 7 are formed. Lower diffusion layer 6 is formed by ordinary ion implantation and thermal treatment. Gate insulating film 7 may be formed by thermally oxidizing the side surfaces of the Si pillars 3 and 3b, or may be formed by an ordinary film deposition method. The method for forming lower diffusion layer 6 and gate insulating film 7 is the same as that of the first exemplary embodiment.

Figure 4D:
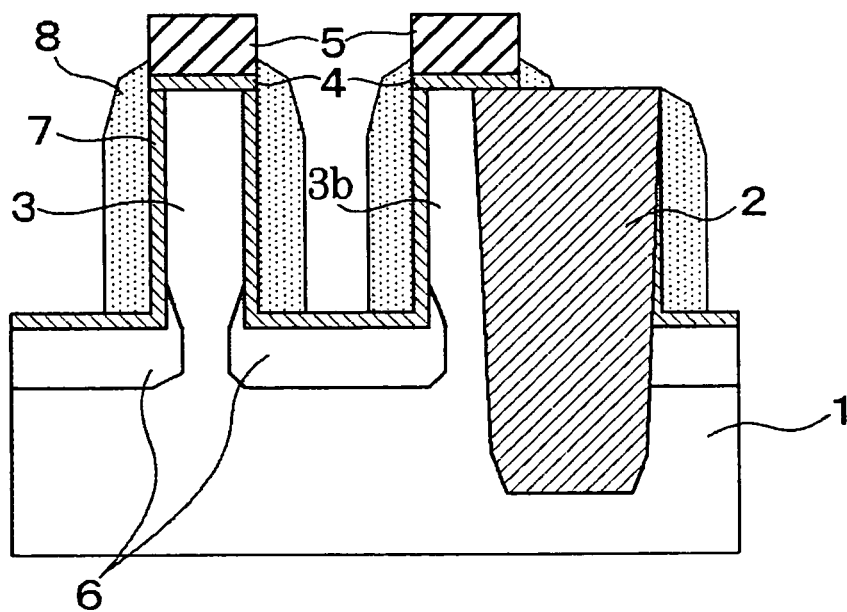

Next, as shown in FIG. 4D, gate electrode 8 is formed on the side surfaces of Si pillars 3 and 3b. Gate electrode 8 is formed by an ordinary etch back method after the gate electrode material is deposited. At this time, the gate electrode material also remains on the side surface of STI insulating film 2. The method for forming the gate electrode is the same as that of the first exemplary embodiment.

Figure 4E:
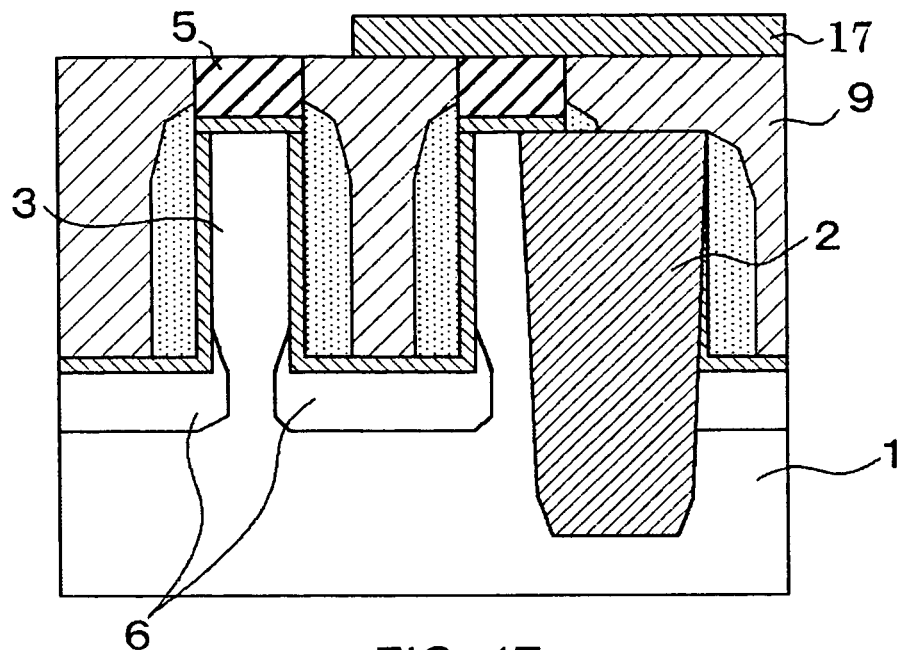

Subsequently, as shown in FIG. 4E, insulating film 9 is deposited and flattened. In this case, flattening of insulating film 9 is carried out by an ordinary CMP method, and the stopper in the CMP method is SiN film 5 which is used as the Si pillar processing mask. Further, after thin insulating film 17 is deposited, thin insulating film 17 described above on an upper portion of Si pillar 3 at the left in the drawing is removed by using ordinary lithography and dry etching. In this case, as thin insulating film 17 described above, a material which is not etched by hot phosphoric acid for removing the above described SiN, and which is higher in HF etching speed than insulating film 9 described above is selected. In this case, an SOG film of a film thickness of 50 nm is selected as thin insulating film 17 described above.

Figure 4F:
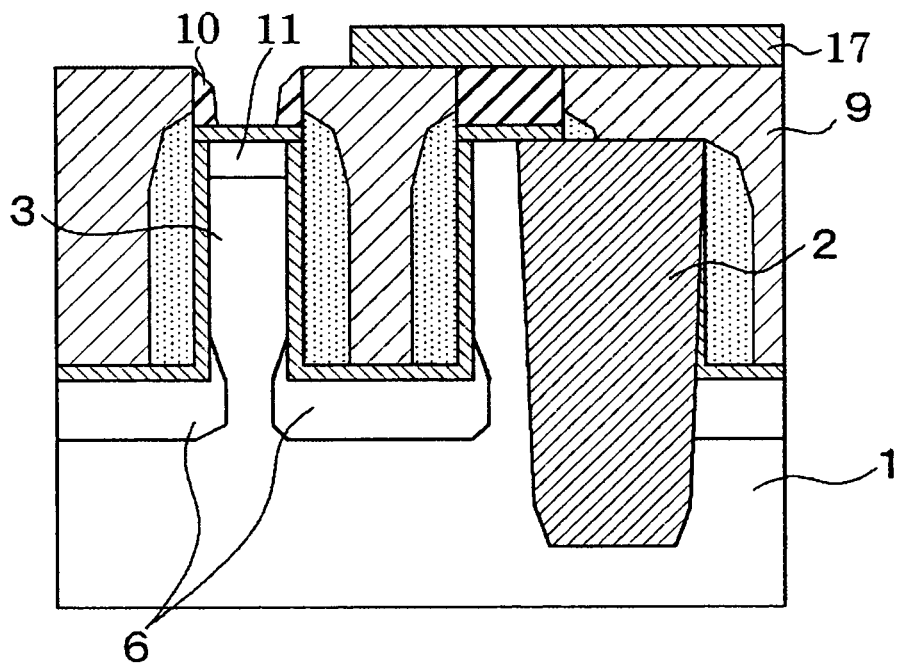

Next, as shown in FIG. 4F, SiN film 5 on Si pillar 3 is removed, and sidewall 10 of an insulating film is formed on the side surface of the opening of the portion where SiN film 5 is removed. Upper diffusion layer 11 is formed by ion implantation and thermal treatment after formation of the sidewall. Here, the method for forming sidewall 10 and upper diffusion layer 11 is the same as in the first exemplary embodiment.

Figure 4G:
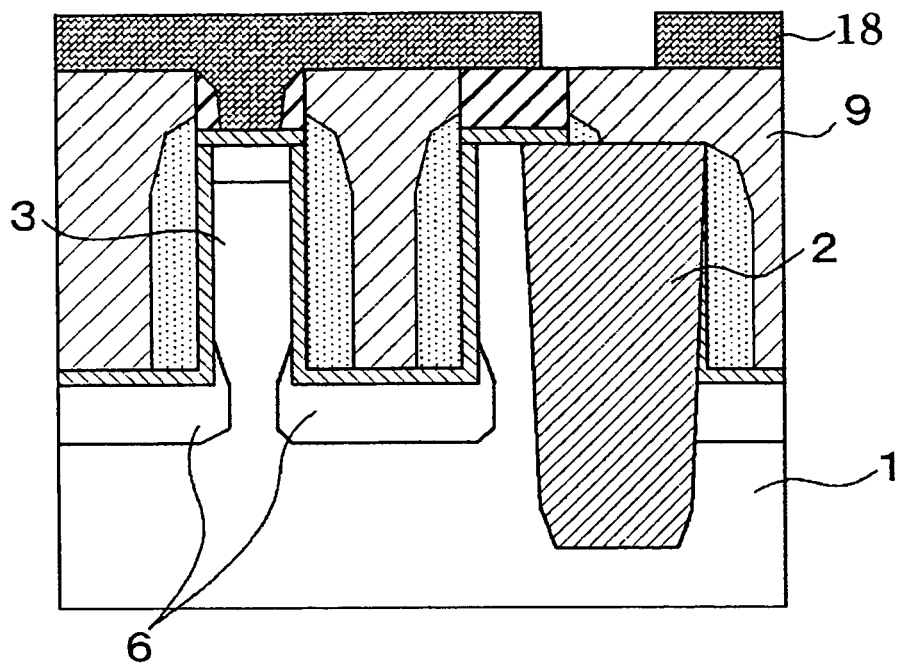
Figure 4H:
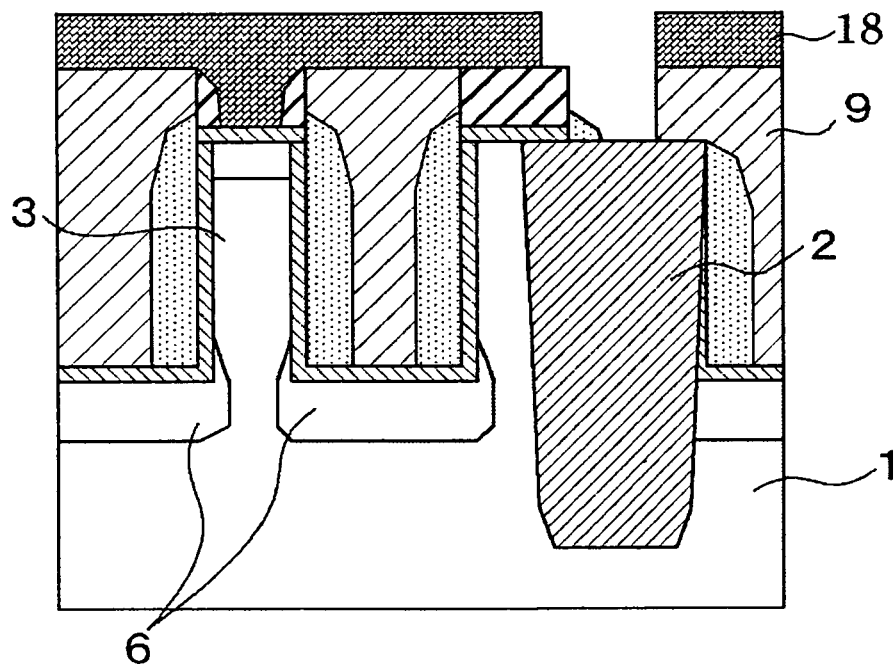

Next, thin insulating film 17 is removed by HF etching. Subsequently, as shown in FIG. 4G, resist mask 18 is formed by ordinary lithography so as to be able to contact gate electrode 8 around Si pillar 3b in contact with the side surface of STI insulating film 2, and a contact hole is provided by dry-etching insulating film 9 as shown in FIG. 4H.

Finally, as in the first exemplary embodiment, upper diffusion layer 11 is exposed, and electrode 13 is buried, and electrode 14 which contacts gate electrode material 8 of the dummy transistor is buried, whereby the structure shown in FIGS. 5A and 5B is produced.

Third Exemplary Embodiment

Configuration of the Third Exemplary Embodiment

Figure 8A:
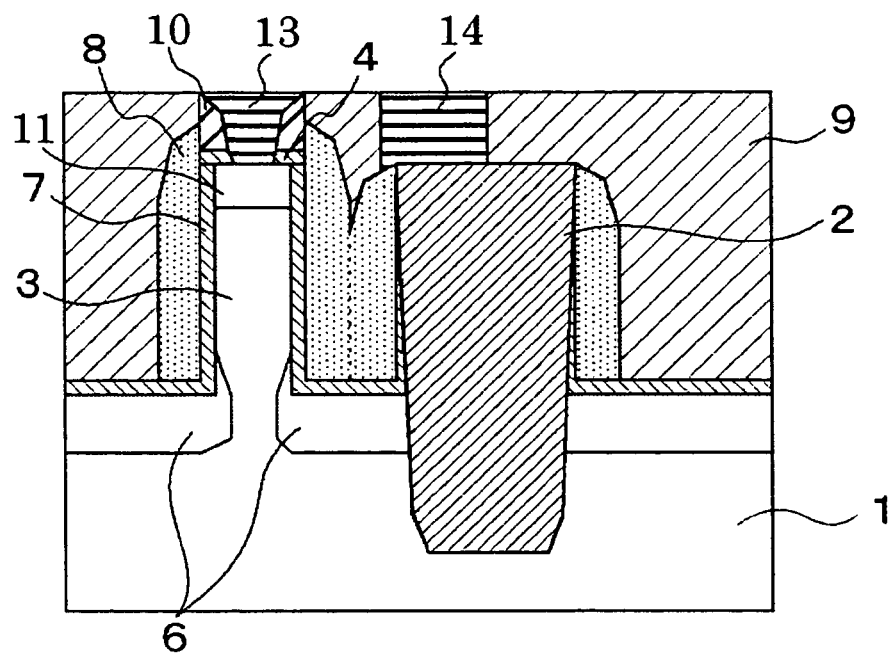

As shown in the sectional view of FIG. 8A, in a semiconductor device in which a vertical MOS transistor including lower diffusion layer 6 and upper diffusion layer 11, with Si pillar 3 made a channel part, and including gate insulating film 7 and gate electrode 8 on a side surface of the channel part is formed in a region surrounded by shallow trench isolation, and lower diffusion layer 6 described above is formed in a portion shallower than the depth of the shallow trench isolation, a contact and STI sidewall electrode 14 are formed in contact with gate electrode material 8 formed on the side surface of STI insulating film 2. In this case, by moving Si pillar 3 of the vertical MOS transistor toward STI insulating film 2, gate electrode 8 of the vertical MOS transistor and gate electrode material 8 described above formed on the side surface of STI insulating film 2 are brought into contact with each other. Thereby, the gate potential of the vertical MOS transistor can be controlled through sidewall electrode 14 over STI insulating film 2 described above. Accordingly, in this configuration, Si pillar 3a and electrode 15 which contacts the gate electrode material formed on the sidewall of Si pillar 3a as shown in FIGS. 3A and 3B are not required.

Figure 8B:
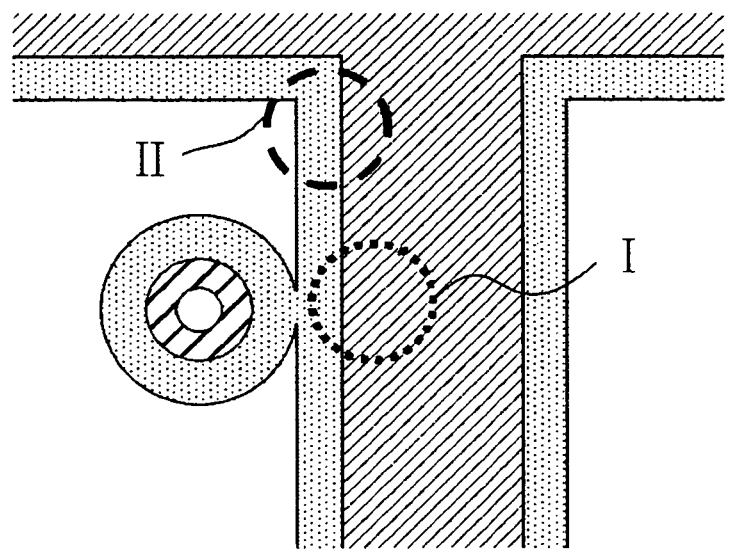
FIG. 8B is a schematic plane view of the same.

For STI sidewall gate electrode 14, an optional place can be selected like an STI sidewall gate electrode contact (I) to an STI sidewall gate electrode contact (II), as shown in the plane view of FIG. 8B. The contact position can be selected in the portion which does not interfere with the disposition of electrode 13 or the like connected to upper diffusion layer 11 of the vertical MOS transistor, and disposition of wiring further on the upper layer of it and the like.

As described above, by controlling the potential of STI sidewall gate electrode 14, the gate potential of the vertical MOS transistor can be controlled. Therefore, formation of a new contact for the gate electrode of the vertical MOS transistor is not required, and layout becomes easy.

Manufacturing Method of the Third Exemplary Embodiment

A method for manufacturing the exemplary embodiment shown in FIG. 8A will be described by using FIG. 7A to FIG. 7G.

Figure 7A:
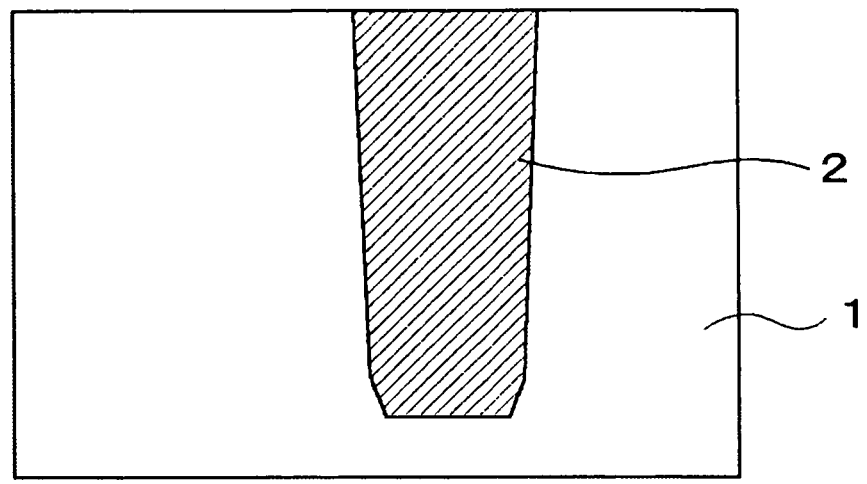
FIG. 7A to FIG. 7G are sectional views explaining one process of a manufacturing process of a semiconductor device which is a third exemplary embodiment of the present invention.

First, as shown in FIG. 7A, STI insulating film 2 is formed in Si substrate 1. STI insulating film 2 is formed by an ordinary method. Specifically, STI insulating film 2 is formed by Si dry etching, burying the insulating film and flattening the insulating film. The method for forming the well and STI insulating film 2 is the same as in the first exemplary embodiment.

Figure 7B:
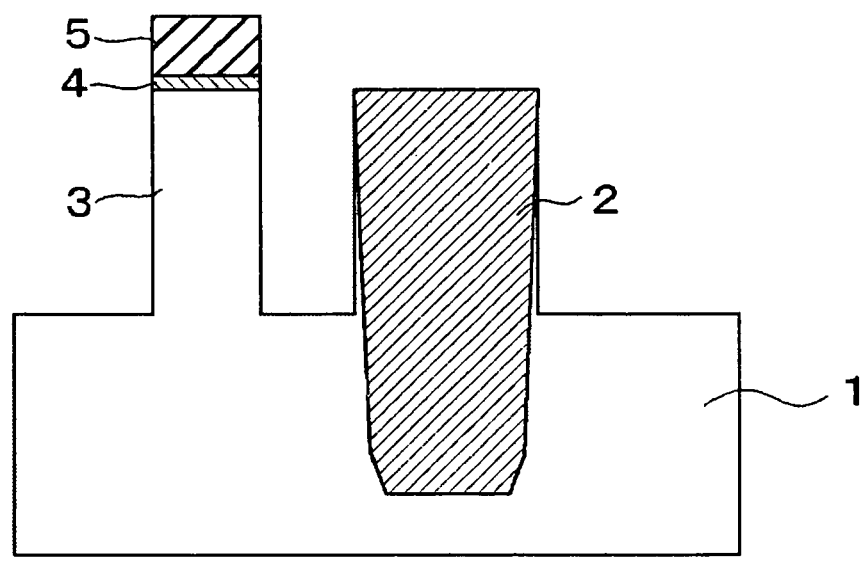

Next, as shown in FIG. 7B, Si processing masks (4, 5) are formed in the portion where Si pillar 3 is to be formed, and Si pillar 3 is formed by ordinary Si dry etching. The method for forming Si pillar 3 is the same as in the first exemplary embodiment.

Figure 7C:
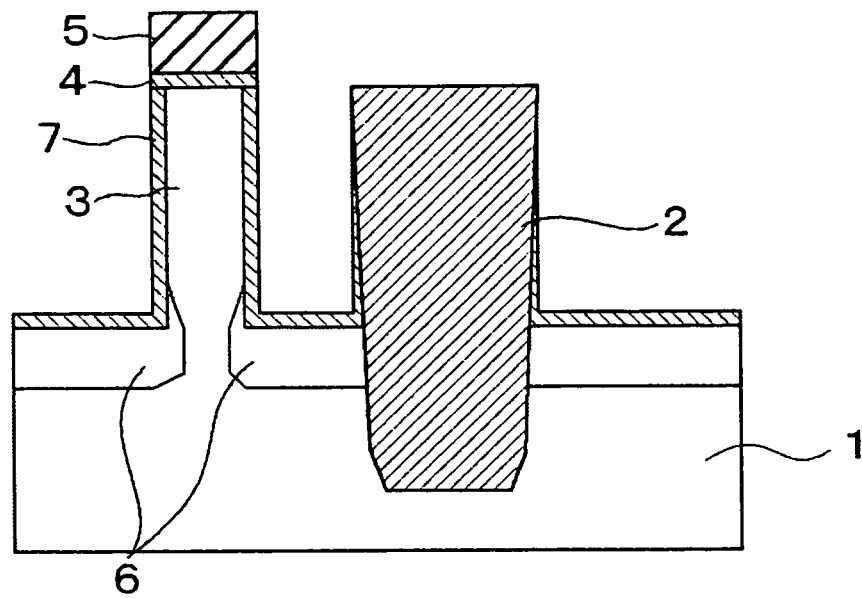

Thereafter, as shown in FIG. 7C, lower diffusion layer 6 and gate insulating film 7 are formed. Lower diffusion layer 6 is formed by ordinary ion implantation and thermal treatment. Gate insulating film 7 may formed by thermally oxidizing the side surface of the Si pillar, or may be formed by an ordinary film deposition method. The method for forming lower diffusion layer 6 and gate insulating film 7 is the same as in the first exemplary embodiment.

Figure 7D:
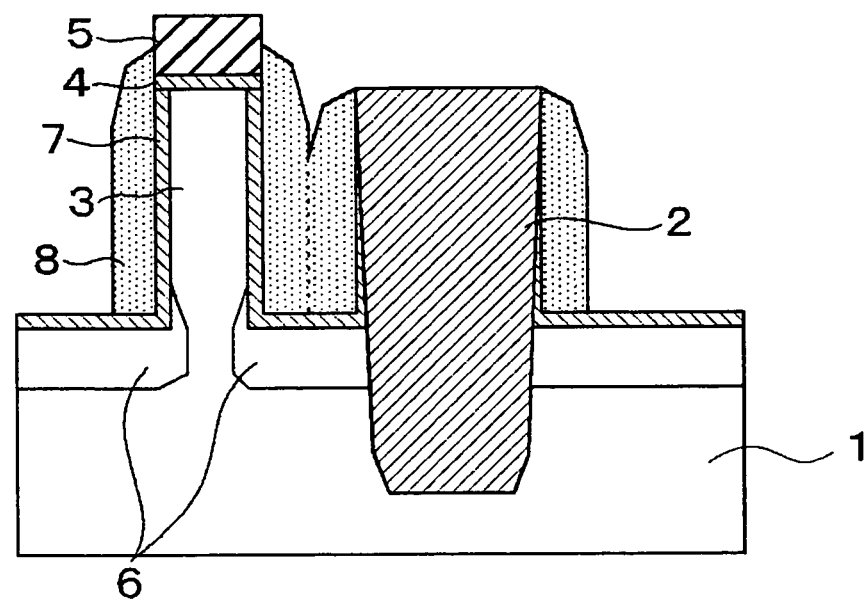

Next, as shown in FIG. 7D, gate electrode 8 is formed on the side surface of Si pillar 3. Gate electrode 8 is formed by an ordinary etch back method after the gate electrode material is deposited. At this time, gate electrode material 8 also remains on the side surface of STI insulating film 2, and gate electrode 8 of the vertical MOS transistor and gate electrode material 8 described above formed on the side surface of STI insulating film 2 are in contact with each other. The method for forming the gate electrode is the same as in the first exemplary embodiment.

Figure 7E:
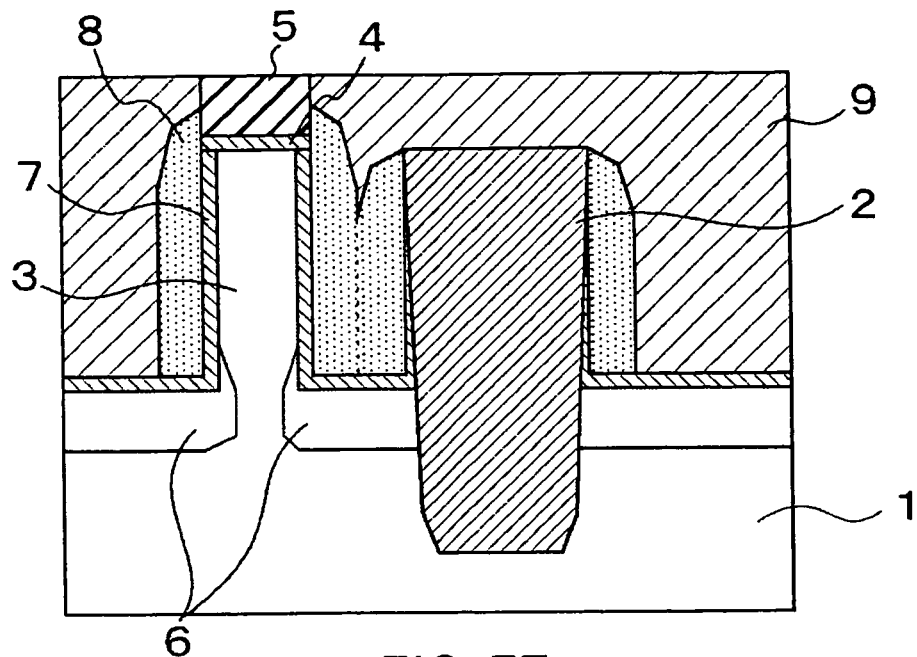

Thereafter, as shown in FIG. 7E, insulating film 9 is deposited and flattened. In this case, flattening of the insulating film is carried out by an ordinary CMP method, and the stopper in the CMP method is SiN film 5 which is used as the processing mask for Si pillar 3.

Figure 7F:
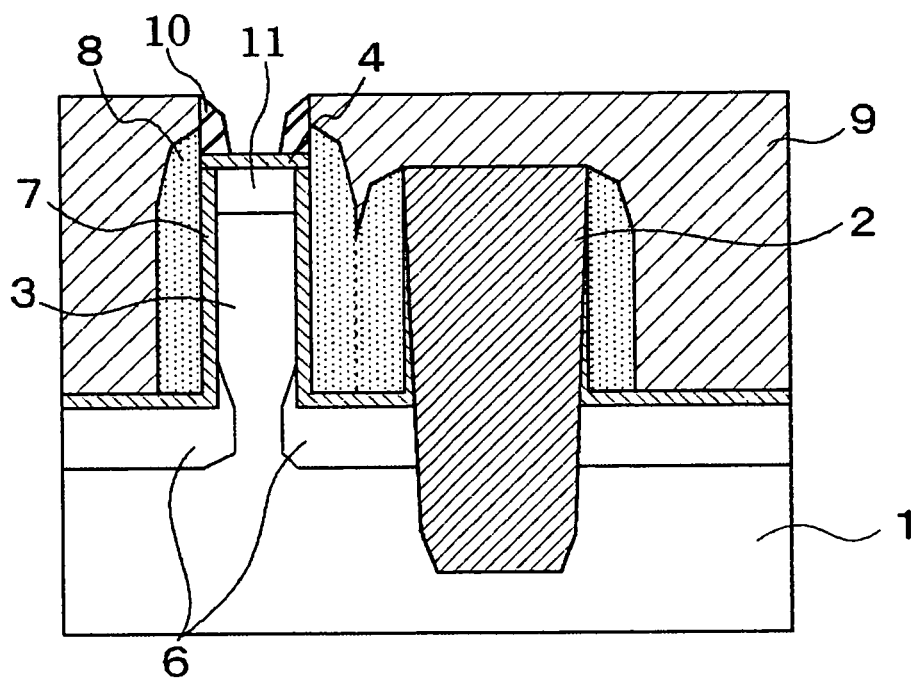

Subsequently, as shown in FIG. 7F, SiN film 5 is removed, and sidewall 10 of an insulating film is formed on the side surface of an opening of the portion where SiN film 5 is removed. Upper diffusion layer 11 is formed by ion implantation and thermal treatment after formation of sidewall 10. In this case, the method for forming sidewall 10 and upper diffusion layer 11 is the same as in the first exemplary embodiment.

Figure 7G:
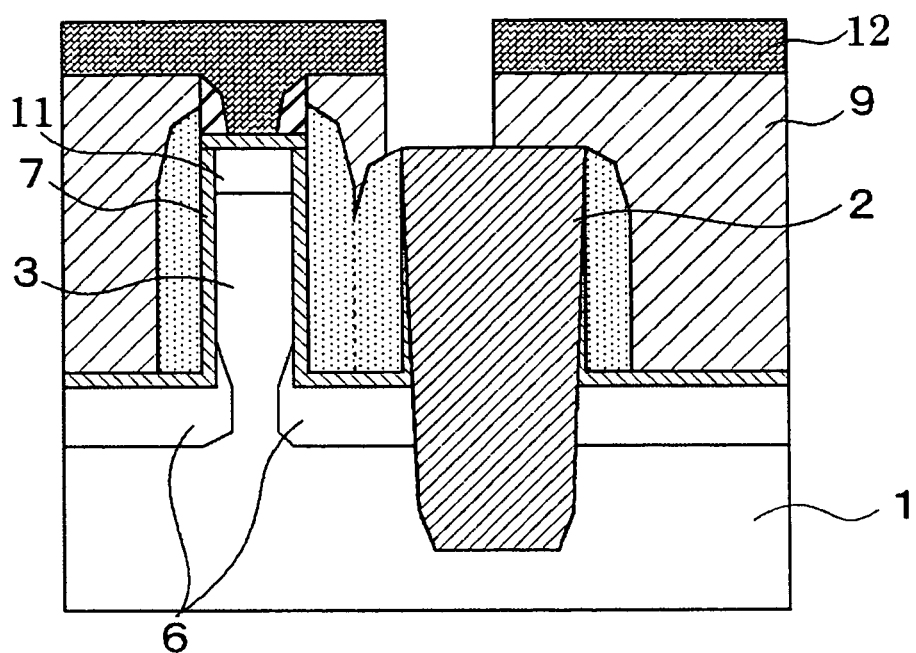

Next, as shown in FIG. 7G, a contact hole is provided in insulating film 9 in the portion where STI sidewall electrode is formed. In this case, resist mask 12 is formed by ordinary photolithography technique, and the contact hole is provided. Finally, after resist mask 12 is removed, silicon oxide film 4 is etched with insulating film sidewall 10 as the mask to expose upper diffusion layer 11, and electrode 13 and electrode 14 are buried. By the method as above, the structure shown in FIGS. 8A and 8B is produced.

In the present exemplary embodiment, Si pillar 3b for the dummy transistor as shown in the second exemplary embodiment may be formed separately from Si pillar 3 for the vertical MOS transistor, and the contact and electrode 14 may be formed in contact with gate electrode material 8 of the dummy transistor. Further, the dummy transistor manufactured in the same process as the vertical MOS transistor may be provided between STI insulating film 2 and the vertical MOS transistor, and the gate potential of the vertical MOS transistor may be controlled by electrode 14 which contacts conductive sidewall 8' via the gate electrode material of the dummy transistor.

Fourth Exemplary Embodiment

Configuration of the Fourth Exemplary Embodiment

Figure 10A:
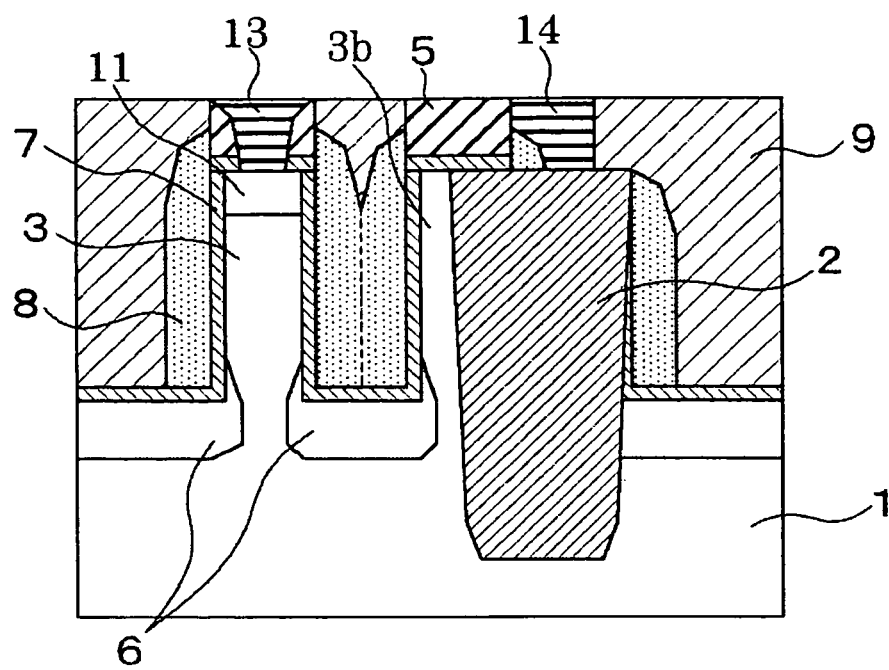

As shown in the sectional view of FIG. 10A, in a semiconductor device in which a vertical MOS transistor including lower diffusion layer 6 and upper diffusion layer 11, with Si pillar 3 made a channel part, and including gate insulating film 7 and gate electrode 8 on a side surface of the channel part is formed in a region surrounded by STI insulating film 2, and lower diffusion layer 6 described above is formed in a portion shallower than the depth of STI insulating film 2, a gate electrode or Si pillar 3b of a dummy transistor of the similar structure as the above described vertical MOS transistor are formed to be at least in contact with the side surface of STI insulating film 2, and a contact and electrode 14 are formed in contact with gate electrode material 8 of the above described dummy transistor which is in contact with the side surface of STI insulating film 2. In this case, by moving Si pillar 3 of the vertical MOS transistor at the left in the drawing closer to Si pillar 3b of the dummy transistor formed to be in contact with the side surface of STI insulating film 2, gate electrodes 8 of both the transistors are in contact with each other. Thereby, the gate potential of the vertical MOS transistor can be controlled through electrode 14.

Figure 10B:
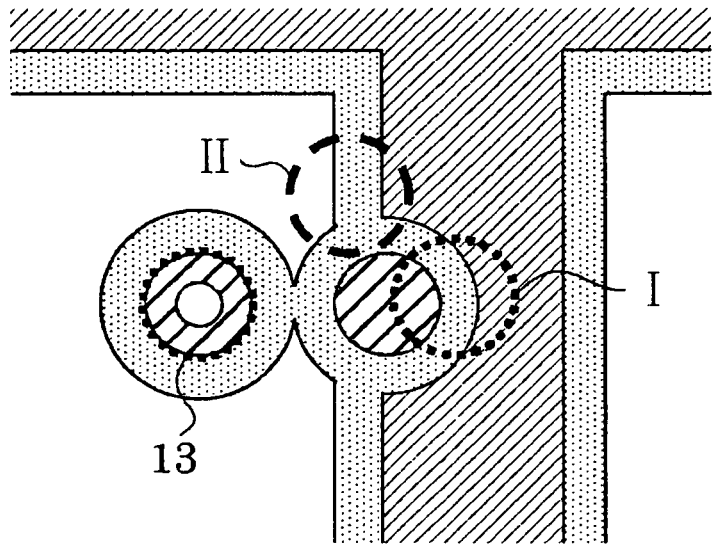
FIG. 10B is a schematic plane view of the same.
Figure 11A:
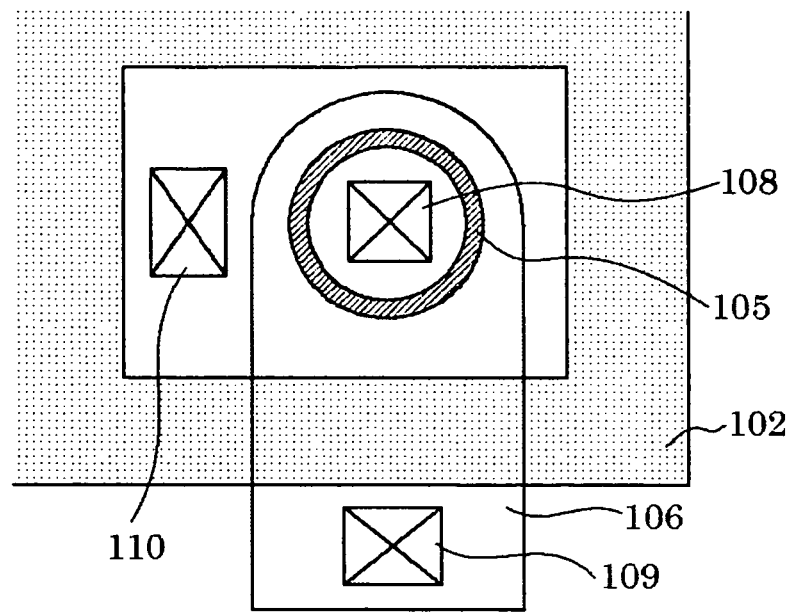
Figure 11B:
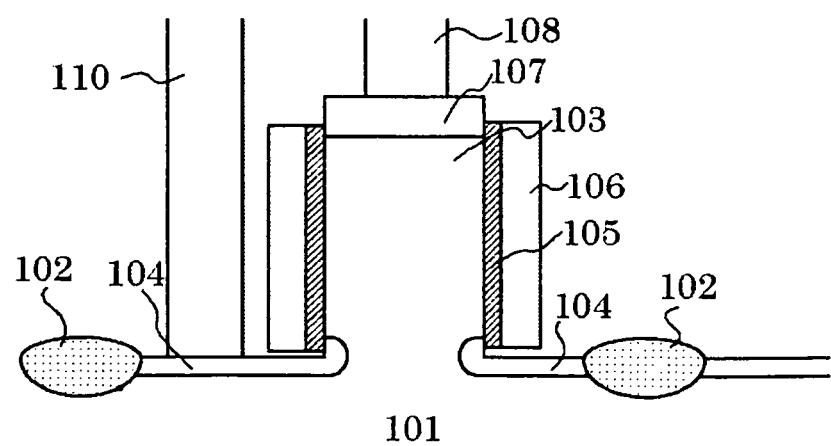
FIG. 11B is a sectional view of the same.

For gate electrode 14 which contacts gate electrode material 8 of the dummy transistor in contact with the side surface of STI insulating film 2, an optional place can be selected like a contact (I) to a contact (II), as shown in the plane view of FIG. 10B. The contact position can be selected in the portion which does not interfere with the disposition of electrode 13 connected to upper diffusion layer 11 of the vertical MOS transistor, and disposition of wiring further on the upper layer of it.

As described above, by controlling the potential of STI sidewall gate electrode 14, the gate potential of the vertical MOS transistor can be controlled. Therefore, formation a new contact for the gate electrode of the vertical MOS transistor is not required, and layout becomes easy. Further, conductive sidewall 8' formed on the side surface of the STI insulating film is not brought into a floating state.

Manufacturing Method of the Fourth Exemplary Embodiment

A method for manufacturing the exemplary embodiment shown in FIG. 10A will be described by using FIG. 9A to FIG. 9G.

Figure 9A:
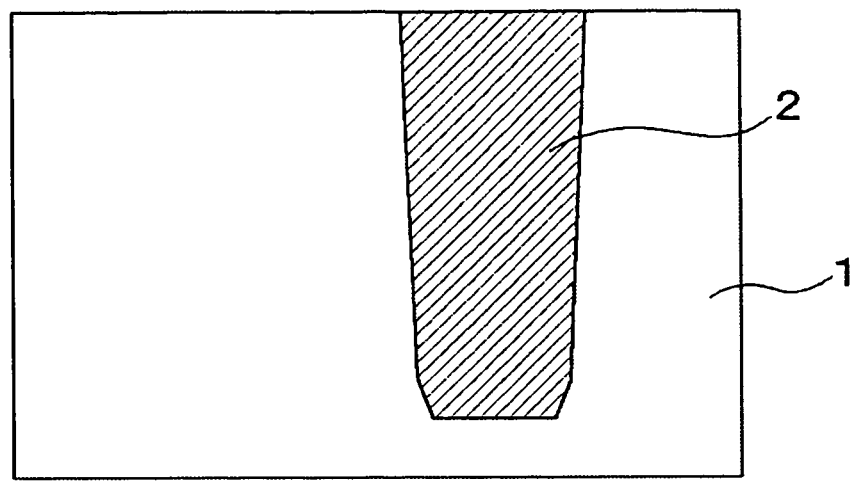
FIG. 9A to FIG. 9G are sectional views explaining one process of a manufacturing process of a semiconductor device which is a fourth exemplary embodiment of the present invention.

First, as shown in FIG. 9A, STI insulating film 2 is formed in Si substrate 1. The method for forming the well and STI insulating film 2 is the same as in the first exemplary embodiment.

Figure 9B:
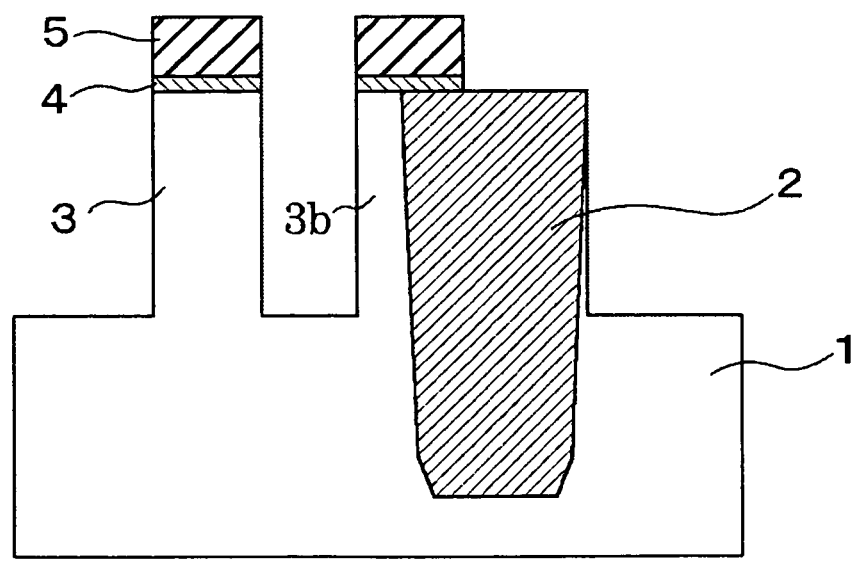

Next, as shown in FIG. 9B, Si processing masks (4, 5) are formed in the portion where Si pillars 3 and 3b are to be formed, and Si pillars 3 and 3b are formed by ordinary Si dry etching. Here, Si pillar 3b in contact with the side surface of STI insulating film 2 is also formed. In the sectional view, Si pillar 3 at the left side in the drawing is shown as if it were not surrounded by shallow trench insulation, but in plane view, Si pillar 3 at the left side in the drawing is formed in the portion surrounded by the area of STI insulating film 2. The method for forming Si pillars 3 and 3b described above is the same as in the first and the second exemplary embodiments.

Figure 9C:
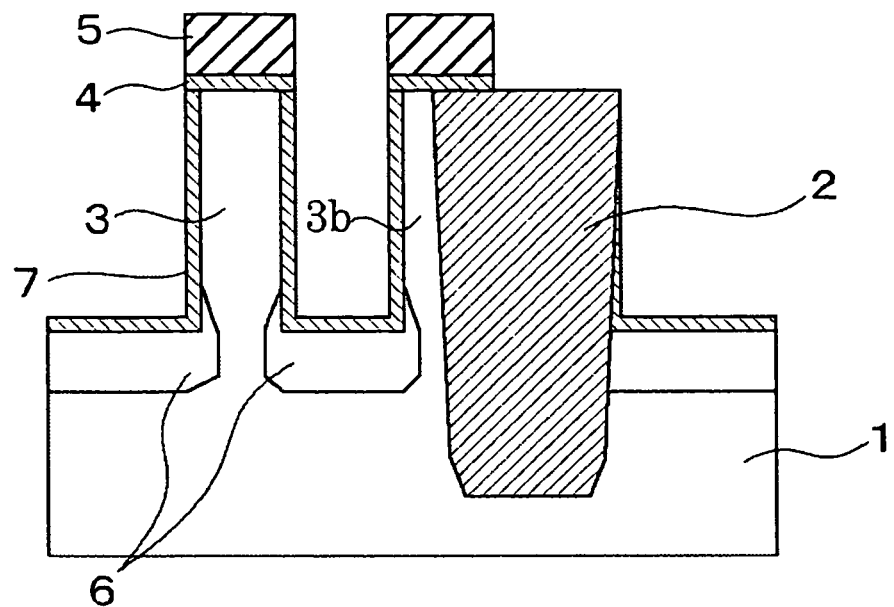

Thereafter, as shown in FIG. 9C, lower diffusion layer 6 and gate insulating film 7 are formed. Lower diffusion layer 6 is formed by ordinary ion implantation and thermal treatment. Gate insulating film 7 may be formed by thermally oxidizing the side wall portion of the Si pillar, or may be formed by an ordinary film deposition method. The method for forming lower diffusion layer 6 and gate insulating film 7 is the same as in the first exemplary embodiment.

Figure 9D:
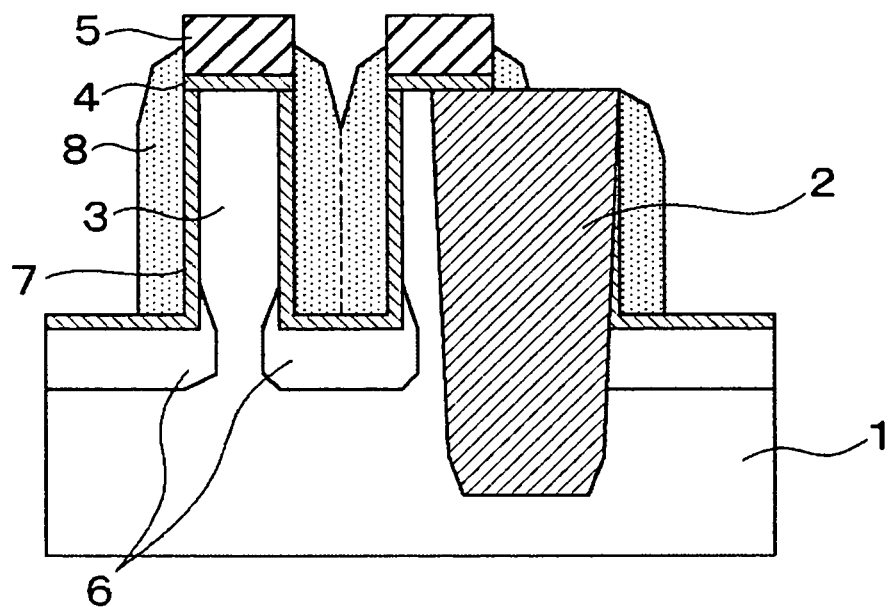

Next, as shown in FIG. 9D, gate electrode 8 is formed on the side surfaces of Si pillars 3 and 3b. Gate electrode is formed by an ordinary etch back method after the gate electrode material is deposited. At this time, gate electrodes 8 of both the transistors are in contact with each other. The method for forming the gate electrodes is the same as in the first exemplary embodiment.

Figure 9E:
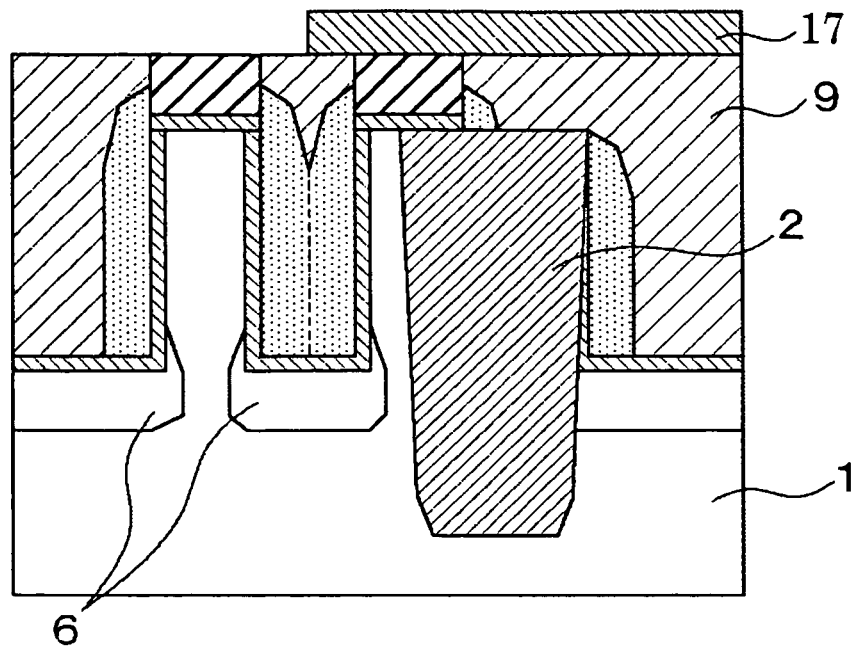

Subsequently, as shown in FIG. 9E, insulating film 9 is deposited and flattened. In this case, flattening of the insulating film is carried out by an ordinary CMP method, and the stopper in the CMP method is SiN film 5 which is used as the Si pillar processing mask. Further, after thin insulating film 17 is deposited, the thin insulating film on Si pillar 3 at the left in the drawing is removed by using ordinary lithography and dry etching. Here, as thin insulating film 17, a material which is not etched by hot phosphoric acid for removing SiN film 5, and is higher in HF etching speed than insulating film 9 is selected. For example, an SOG film is selected as the thin insulating film.

Figure 9F:
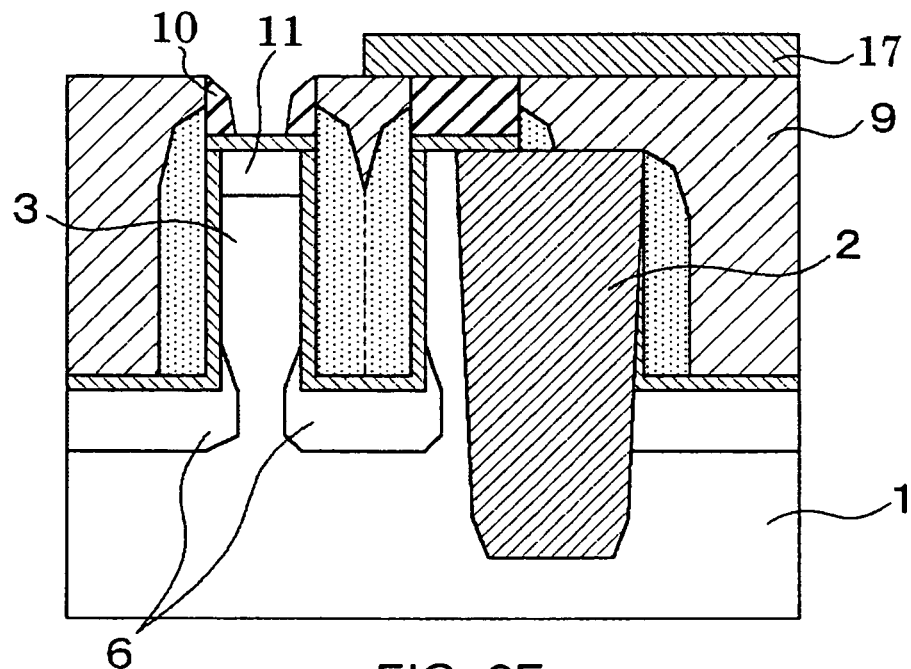

Next, as shown in FIG. 9F, SiN film 5 on Si pillar 3 is removed, and sidewall 10 of an insulating film is formed on the side surface of an opening of the portion where SiN film 5 is removed. Upper diffusion layer 11 is formed by ion implantation and thermal treatment after formation of sidewall 10. In this case, the method for forming sidewall 10 and upper diffusion layer 11 is the same as in the first exemplary embodiment.

Figure 9G:
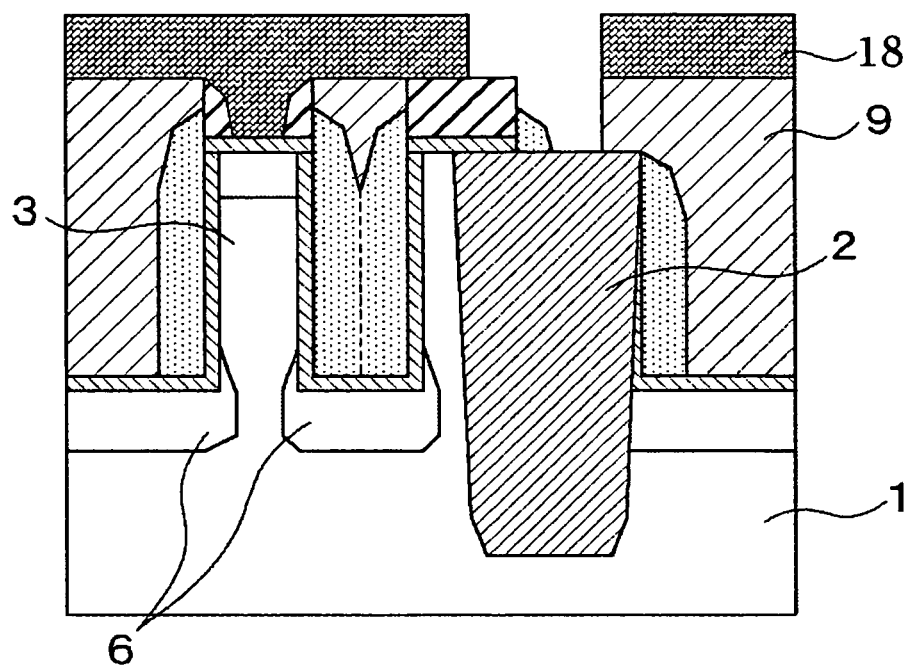

Next, as shown in FIG. 9G, thin insulating film 17 is removed by HF etching, resist mask 18 is formed by ordinary lithography technique so as to be able to contact gate electrode 8 around Si pillar 3b in contact with the side surface of STI insulating film 2, and a contact hole is provided by dry-etching insulating film 9.

Finally, $SiO_2$ film 4 on Si pillar 3 is etched with insulating film sidewall 10 as the mask to expose upper diffusion layer 11, and electrode 13 is buried. Further, electrode 14 is buried in the contact hole of gate electrode 8 around Si pillar 3b. By the method as above, the structure shown in FIGS. 10A and 10B is completed.

In the above example, the shape of the Si pillar is described as a circular cylinder, but the shape of the Si pillar is not limited to this, and can be various shapes such as a polygonal cylinder, and an oval cylinder. Further, the shapes of the Si pillar for the vertical MOS transistor and the Si pillar for the dummy transistor do not have to be the same, and may be different shapes of difference sizes in accordance with the object.

The semiconductor device of the present invention can be favorably used for the cell transistor of a semiconductor recording device such as a DRAM, and can configure a microscopic cell such as a $4F^2$ cell.

It is apparent that the present invention is not limited to the above embodiments, but may be modified and changed without departing from the scope and spirit of the invention.

What is claimed is:

1. A semiconductor device including a vertical MOS (metal-oxide semiconductor) transistor, the semiconductor device comprising:
    an isolation layer formed in a semiconductor substrate configured to define an isolation area and an active area surrounded by said isolation area;
    a semiconductor pillar formed on said active area;
    a first gate electrode formed above a sidewall of said semiconductor pillar;
    a conductive layer formed above a sidewall of said isolation layer; and
    an electrode electrically coupled to said conductive layer supplying a voltage to prevent said conductive layer from a floating state,
    wherein the first gate electrode and the conductive layer have the respective sidewall structure including a rounded top surface.

2. The semiconductor device according to claim 1, wherein said first gate electrode is electrically separated from said conductive layer.

3. The semiconductor device according to claim 1, wherein said first gate electrode is electrically connected to said conductive layer.

4. The semiconductor device according to claim 1, further comprising a bottom diffusion layer formed at the bottom of said pillar, and a top diffusion layer formed at the top of said pillar.

5. The semiconductor device according to claim 1, wherein a bottom of said isolation layer is deeper in a depth direction than that of said bottom diffusion layer.

6. The semiconductor device according to claim 1, wherein said isolation layer comprises a shallow trench isolation layer.

7. A semiconductor device including a vertical MOS (metal-oxide semiconductor) transistor, the vertical MOS transistor comprising:
   a semiconductor pillar formed in an area subjected to a shallow trench isolation layer of a semiconductor substrate,
   a lower diffusion layer formed shallower than a depth of a shallow trench isolation, in the semiconductor substrate at a lower portion of the semiconductor pillar,
   an upper diffusion layer formed at an upper portion of the semiconductor pillar,
   a channel part formed in a region sandwiched by the upper and lower diffusion layers,
   a gate insulating film and a gate electrode included on a side surface of the channel part;
   a conductive sidewall formed on a side surface of an insulating film of said shallow trench isolation; and
   an electrode electrically coupled to said conductive sidewall supplying a voltage to prevent said conductive sidewall from a floating state,
   wherein said electrode contacts the conductive sidewall via a gate electrode of a dummy transistor, the gate electrode of the dummy transistor comprising the conductive sidewall.

8. The semiconductor device according to claim 7, further comprising the dummy transistor formed between said shallow trench isolation layer and said vertical MOS transistor, and a gate potential of the vertical MOS transistor is controlled through the electrode contacting said conductive sidewall via a gate electrode material of the dummy transistor, the gate electrode material of the dummy transistor including the conductive sidewall.

9. The semiconductor device according to claim 1, wherein a dummy transistor includes a gate electrode material of the conductive layer formed on a side surface of the isolation layer.

10. The semiconductor device according to claim 1, wherein a gate potential of the vertical MOS transistor is controlled by the electrode which contacts the conductive layer via a gate electrode material of a dummy transistor to eliminate the floating state, the conductive layer including the gate electrode material of the dummy transistor.

11. The semiconductor device according to claim 1, wherein the electrode is configured to control the potential of a gate electrode material of the conductive layer by the conductive layer being in contact with the first gate electrode through a dummy transistor to prevent the floating state, the conductive layer including the gate electrode material of the dummy transistor.

12. The semiconductor device according to claim 1, wherein a gate potential of the vertical MOS transistor is controlled through the electrode contacting the conductive layer via a gate electrode material of the dummy transistor to be devoid of the conductive layer being in the floating state, the conductive layer including the gate electrode material of the dummy transistor.

13. The semiconductor device according to claim 1, further comprising a dummy transistor formed between the isolation layer and the vertical MOS transistor, and a gate potential of the vertical MOS transistor is controlled through the electrode contacting the conductive layer via a gate electrode material of a dummy transistor, the conductive layer including the gate electrode material of the dummy transistor.

14. The semiconductor device according to claim 1, wherein the electrode is configured to control a potential of the conductive layer in order to control a gate potential at the first gate electrode of the vertical MOS transistor.

15. The semiconductor device as claimed in claim 1,
   wherein the conductive layer includes a first portion being in direct contact with the first gate electrode and a second portion not being in contact with the first gate electrode; and
   wherein the electrode is arranged at a position where the electrode is in direct touch with the second portion and is not in touch with the first portion.

16. The semiconductor device as claimed in claim 7,
   wherein the conductive sidewall includes a first portion being in direct contact with the gate electrode and a second portion not being in contact with the gate electrode; and
   wherein the electrode is arranged at a position where the electrode is in direct touch with the second portion and is not in touch with the first portion.

17. The semiconductor device as claimed in claim 7, wherein the gate electrode and the conductive sidewall have the respective sidewall structure including a rounded top surface.

18. The semiconductor device according to claim 7, wherein the electrode that is electrically coupled to said conductive sidewall is configured to control a supply of the voltage to prevent the conductive sidewall from a floating state.

19. A semiconductor device including a vertical MOS (metal-oxide semiconductor) transistor, the semiconductor device comprising:
   an isolation layer formed in a semiconductor substrate to define an active area;
   a semiconductor pillar formed on said active area;
   a gate electrode formed above a sidewall of said semiconductor pillar to wholly surround said semiconductor pillar;
   a conductive layer formed above a sidewall of said isolation layer; and
   an electrode formed to be electrically coupled to said conductive layer.

20. The semiconductor device as claimed in claim 1, wherein the conductive layer includes a first portion being in direct contact with the gate electrode and a second portion not being in contact with the gate electrode, and
   wherein the electrode is arranged at a position where the electrode is in direct contact with the second portion and is not in contact with the first portion.

21. The semiconductor device as claimed in claim 1, further comprising:
   a dummy transistor formed on a side surface of a shallow trench isolation to be arranged between said isolation layer and said gate electrode, a gate electrode of the dummy transistor comprising the conductive layer,
   wherein a gate potential of the vertical MOS transistor is controlled through the electrode via the gate electrode of the dummy transistor.

* * * * *